(12) United States Patent
Reid et al.

(10) Patent No.: US 6,800,187 B1
(45) Date of Patent: Oct. 5, 2004

(54) CLAMSHELL APPARATUS FOR ELECTROCHEMICALLY TREATING WAFERS

(75) Inventors: Jonathan D. Reid, Sherwood, OR (US); Steven T. Mayer, Lake Oswego, OR (US); R. Marshall Stowell, West Linn, OR (US); Evan E. Patton, Portland, OR (US); Jeff A. Hawkins, Portland, OR (US)

(73) Assignee: Novellus Systems, Inc., San Jose, CA (US)

( * ) Notice: Subject to any disclaimer, the term of this patent is extended or adjusted under 35 U.S.C. 154(b) by 214 days.

(21) Appl. No.: 09/927,741

(22) Filed: Aug. 10, 2001

Related U.S. Application Data

(60) Provisional application No. 60/295,245, filed on May 31, 2001.

(51) Int. Cl.[7] .............................................. C25D 5/00
(52) U.S. Cl. ...................... 205/118; 205/133; 205/148; 204/224 R; 204/275.1; 427/98; 427/304
(58) Field of Search ................................. 205/118, 133, 205/148; 204/224 R, 275.1; 427/98, 304

(56) References Cited

U.S. PATENT DOCUMENTS

| | | | |
|---|---|---|---|
| 5,000,827 A | * | 3/1991 | Schuster et al. ............ 205/118 |
| 5,221,449 A | | 6/1993 | Colgan et al. |
| 5,281,485 A | | 1/1994 | Colgan et al. |
| 5,482,611 A | | 1/1996 | Helmer et al. |
| 5,985,762 A | | 11/1999 | Geffken et al. |
| 6,074,544 A | | 6/2000 | Reid et al. |
| 6,099,702 A | | 8/2000 | Reid et al. |
| 6,110,346 A | | 8/2000 | Reid et al. |
| 6,124,203 A | | 9/2000 | Joo et al. |
| 6,126,798 A | | 10/2000 | Reid et al. |
| 6,139,712 A | | 10/2000 | Patton et al. |
| 6,156,167 A | | 12/2000 | Patton et al. |
| 6,159,354 A | | 12/2000 | Contolini et al. |
| 6,162,344 A | | 12/2000 | Reid et al. |
| 6,179,973 B1 | | 1/2001 | Lai et al. |
| 6,179,983 B1 | | 1/2001 | Reid et al. |
| 6,193,854 B1 | | 2/2001 | Lai et al. |
| 6,217,716 B1 | | 4/2001 | Fai Lai |
| 6,221,757 B1 | | 4/2001 | Schmidbauer et al. |
| 6,251,242 B1 | | 6/2001 | Fu et al. |
| 6,274,008 B1 | | 8/2001 | Gopalraja et al. |
| 6,277,249 B1 | | 8/2001 | Gopalraja et al. |
| 6,413,388 B1 | * | 7/2002 | Uzoh et al. .............. 204/224 R |
| 6,540,899 B2 | * | 4/2003 | Keigler ....................... 205/118 |
| 2002/0084183 A1 | * | 7/2002 | Hanson et al. .......... 204/224 R |

* cited by examiner

*Primary Examiner*—Wesley A. Nicolas
(74) *Attorney, Agent, or Firm*—Beyer, Weaver & Thomas, LLP.

(57) ABSTRACT

An apparatus for engaging a work piece during plating facilitates electrolyte flow during a plating operation. The apparatus helps to control the plating solution fluid dynamics and electric field shape to keep the wafer's local plating environment uniform and bubble free. The apparatus holding the work piece in a manner that facilitates electrolyte circulation patterns in which the electrolyte flows from the center of the work piece plating surface, outward toward the edge of the edge of the work piece. The apparatus holds the work piece near the work piece edges and provides a flow path for electrolyte to flow outward away from the edges of the work piece plating surface. That flow path has a "snorkel" shape in which the outlet is higher than the inlet. In addition, the flow path may have a slot shape that spans much or all of the circumference of holding apparatus. It may be made from a material that resists deformation and corrosion such as certain ceramics.

45 Claims, 25 Drawing Sheets

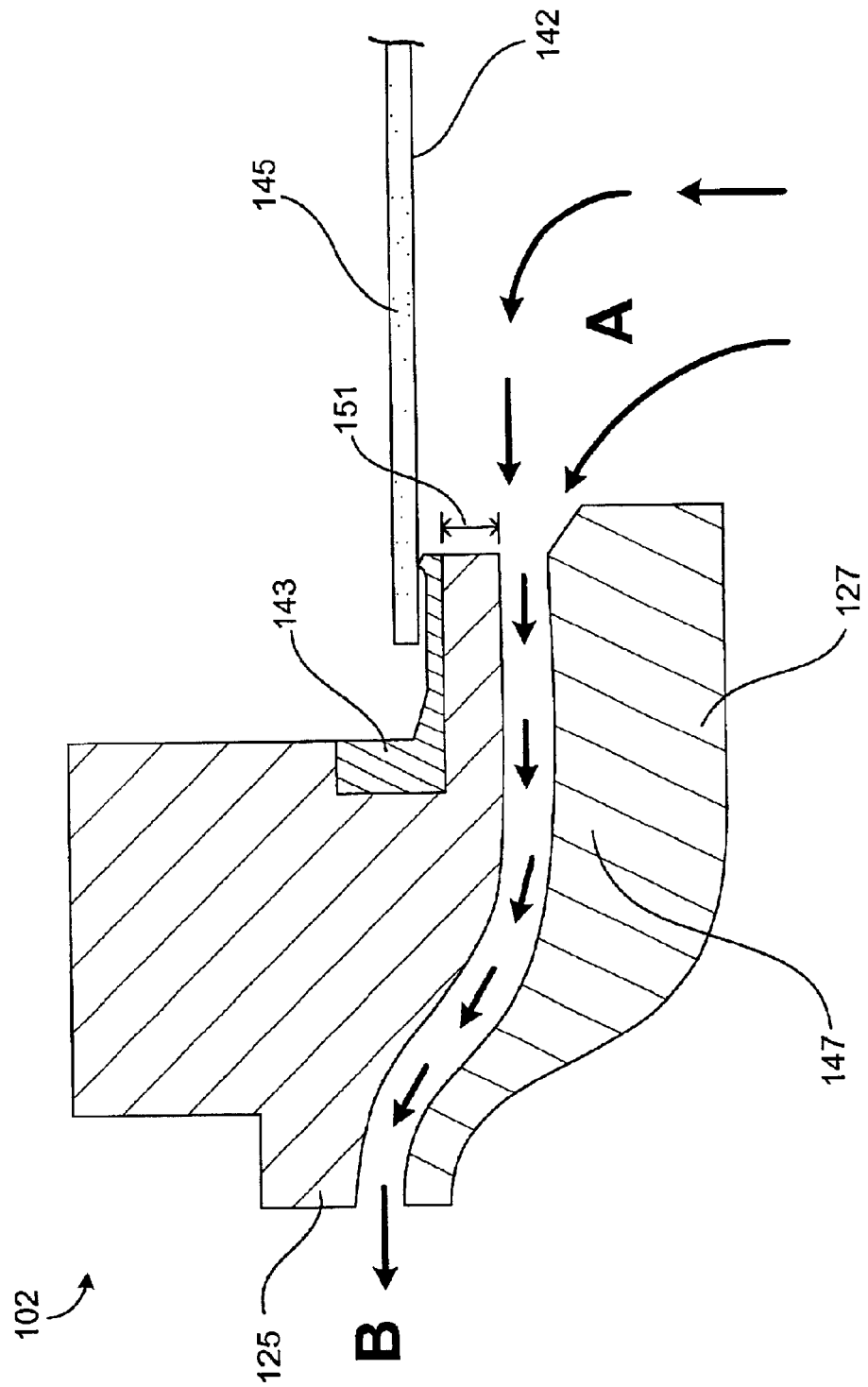

CLAMSHELL APPARATUS FOR ELECTROCHEMICALLY TREATING WAFERS

CROSS-REFERENCE TO RELATED APPLICATIONS

This application claims priority under 35 USC 119(e) from U.S. Provisional Application No. 60/295,245, having Jonathan D. Reid et al. as inventors, filed May 31, 2001, and titled "Improved Clamshell Apparatus for Electrochemically Treating Wafers." This application is related to the following U.S. Patent Applications: U.S. patent application Ser. No. 09/872,340 naming Evan Patton, David Smith, Jonathan Reid, and Steven Mayer as inventors, titled "Methods and Apparatus for Bubble Removal in Wafer Wet Processing," filed May 31 2001; U.S. patent application Ser. No. 09/872,341 U.S. Pat. No. 6,551,487, naming Jonathan Reid, Evan E. Patton, Dinesh Kalakkad, Steven Mayer, David Smith, Sasha Varadarajan, and Gary Lind as inventors, titled "Methods and Apparatus for Controlled Angle Wafer Immersion," filed May 31, 2001; and U.S. Provisional Patent Application No. 60/295,116 naming Steven Mayer, Marshall Stowe, Evan Patton, and Sasha Varadarajan as inventors titled "Methods and Apparatus for Controlling Electrolyte Flow for Uniform Plating," filed May 31, 2001. Each of the four applications cited above is incorporated herein by reference for all purposes.

FIELD OF THE INVENTION

This invention relates to plating technology. More specifically, it relates to silicon wafer electroplating technology. Even more specifically, the invention pertains to particular apparatus and methods for controlling plating solution flow dynamics and electric field shape during electroplating.

BACKGROUND OF THE INVENTION

Electroplating and electroless plating have many applications. One very important developing application is in plating copper onto semiconductor wafers to form conductive copper lines for "wiring" individual devices of the integrated circuit. Often this plating process serves as a step in the damascene fabrication procedure.

A continuing issue in modem VLSI wafer electroplate processing is quality of the deposited metal film. Given that metal line widths reach into the deep sub-micron range and given that the damascene trenches often have very high aspect ratios, electroplated films must be exceedingly homogeneous (chemically and physically). They must have uniform thickness over the face of a wafer and must have consistent quality across numerous batches.

Some wafer processing apparatuses are designed to provide the necessary uniformity. One example is the SABRE™ clamshell electroplating apparatus available from Novellus Systems, Inc. of San Jose, Calif. and described in U.S. Pat. Nos. 6,156,167 and 6,139,712, which are herein incorporated by reference in their entireties. The clamshell apparatus provides many advantages for wafer throughput and uniformity; most notably, wafer back-side protection from contamination during electroplating, wafer rotation during the electroplating process, and a relatively small footprint for wafer delivery to the electroplating bath (vertical immersion path).

Modifications to the "clamshell" and its associated plating environment for improved wafer uniformity and quality have been described in U.S. Pat. Nos. 6,074,544, 6,110,346, 6,162,344, and 6,159,354 which are herein incorporated by reference in their entirety. The described modifications relate to methods for using variable currents, improved mass transfer, and electric potential shaping.

Although plating uniformity has improved, as mentioned, there is a continuing need for higher uniformity and plating quality. This is especially true with regard to what a wafer "sees" during plating, that is, the local environment of the wafer during plating. Plating solution flow patterns and velocity, bubbles, electric field shape, and the like affect the quality of the deposited metal film. One issue of particular importance is the electrolyte velocity distribution across the wafer surface. For many combinations of apparatus and operating conditions, the electrolyte velocity varies significantly in the radial direction across the wafer surface. Because the plating rate and quality is a function of local velocity, this condition causes uneven plating thickness and/or quality.

With the deleterious effects of bubbles as well as specific flow patterns and electric field shape on the quality in mind, tighter control of certain design parameters should be realized. What is needed therefore is improved technology for controlling plating solution flow dynamics and electric field shape during electroplating.

SUMMARY OF THE INVENTION

The present invention provides apparatus and methods for engaging a work piece during plating and plating a material onto the work piece. Although specific embodiments of this invention are described in terms of electroplating, the invention is also embodied in apparatus for electroless plating (plating metal onto a work piece via non-electrolytic reduction of metal ions from plating fluids). Generally the invention controls plating solution fluid dynamics and electric field shape (in the case of electroplating). It keeps the wafer's local plating environment relatively uniform and bubble free to deposit a film of consistent thickness and quality across the wafer surface. The invention employs an apparatus for holding the work piece in a manner that facilitates electrolyte circulation patterns in which the electrolyte flows from the center of the work piece plating surface, outward toward the edge of the edge of the work piece. The apparatus holds the work piece near the work piece edges and provides a flow path for electrolyte to flow outward away from the edges of the work piece plating surface. That flow path has a "snorkel" shape in which the outlet is higher than the inlet. In addition, the flow path preferably a slot shape that spans much or all of the circumference of holding apparatus. It may be made from a material that resists deformation such as certain ceramics.

In one aspect, the invention provides an apparatus for engaging a work piece during plating. The apparatus may be characterized by the following elements: (a) a cup having a circumferential side wall defining an interior region and a lip within the interior region; (b) a field shaping element; (c) a flow path defining a passage for plating fluid to flow from inside the apparatus to outside the apparatus; and (d) a cone having a work piece contact surface that fits within the cup's interior and can contact the work piece in a manner that holds the work piece in a fixed position against the cup's lip. In this embodiment, the cup is arranged such that lip can support the work piece while the work piece remains within the interior region. The field shaping element is shaped and sized to affect an electric field shape impinging on the work piece during plating. The field shaping element is also designed for connection with the cup. The flow path resides in a region between the field shaping region and the cup. It has an inlet on the inside of the apparatus and an outlet on the outside of the apparatus and is positioned such that the outlet is at a higher elevation than the inlet when the apparatus oriented for use with the cup above the field shaping element.

The apparatus may include one or more actuators for moving the work piece into and out of the plating fluid, while the work piece is held in position by the cup and cone. These actuators can pivot the work piece about an axis defined on or proximate the work piece.

In a particular embodiment, the cup's lip is sized and shaped to support a semiconductor wafer work piece. In other words, the apparatus is designed to plate semiconductor wafers (with copper in a specific embodiment). The may include a lipseal made from a material that provides a fluid tight seal with the semiconductor wafer when the wafer is held in place by the cone. This seal protects the backside of the wafer from the plating environment. As an example, the lipseal material may be an elastomer.

The cup can be made from various materials. Preferably, the material resists plating chemicals, resists deformation when pressure is applied from the cone (it is mechanically rigid), and possesses mechanical strength. Among the suitable materials are certain ceramics (alumina, zirconia), plastics, fluoropolymer or other plastic-coated metals and/or ceramics, glasses or glass-coated metals, and composite materials. Note that in many embodiments, the portion of the cup facing the inside of the apparatus is most prone to deformation. Therefore, sometimes only that portion of the cup need be made from special material.

The cup and the field shaping element can form a unitary element of the apparatus or they can be separate elements held in fixed positions with respect to one another by a fastener. In the latter case, the fastener allows a separation distance between the cup and field shaping element to be adjusted to thereby adjust a dimension of the flow path.

The flow path may have a slot shape that is substantially coextensive with the cup's circumferential side wall. The slot may be continuous around the entire perimeter or it may be discontinuous. In an alternative embodiment, the flow path may have a hole shape. In this embodiment, the apparatus will generally include a plurality of hole shaped flow paths distributed about the cup's circumferential sidewall. Either flow path can have a "snorkel" type design, wherein the inlet is lower in elevation than the outlet. Particular shapes and designs, not meant to limit the scope of the invention will be described below.

In another aspect, the invention provides a method of plating a material onto a work piece. Such method may be characterized by the following sequence: (a) holding the work piece between a cone and a cup of an apparatus; and (b) while plating, directing plating fluid through a flow path defining a passage for plating fluid to flow from inside the apparatus to outside the apparatus. The flow path should have an inlet and an outlet in the snorkel arrangement as described above. In this manner, any gas present in the flow path travels toward the outlet due to its buoyancy and entrainment in the fluid flow stream. In this method, the cup and cone are preferably designed as described above.

In one embodiment, the plating fluid is directed toward a substantially flat plating surface of the work piece (e.g., a wafer's active surface), thereby setting up a circulation pattern in which the plating fluid flows along the plating surface and through the flow path. When the work piece has a substantially flat plating surface, immersion of the work piece can take place at an angle in which the plating surface is not parallel to a plane defined by the plating fluid surface. In this arrangement, buoyancy aids in the elimination of gas from the work piece plating surface. The work piece can also be rotated about an axis substantially parallel to the circumferential side-wall during immersion and plating.

These and other features and advantages of the present invention will be described in more detail below with reference to the associated figures.

BRIEF DESCRIPTION OF THE DRAWINGS

The detailed description that follows can be more fully understood when considered in conjunction with the drawings in which:

FIG. 1F depicts an alternative flow path formed between the cup and the field shaping element.

DETAILED DESCRIPTION OF THE PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. For example, the invention is described in terms of a "clamshell" electroplating apparatus; other apparatus can embody the invention as well. In some descriptions herein, well-known processes, procedures, and components have not been described in detail so as not to unnecessarily obscure aspects of the present invention.

The following description assumes that the work piece to be plated is a wafer, more particularly a semiconductor wafer. The invention is not so limited. The work piece may be of various shapes, sizes, and materials. In addition to semiconductor wafers, other work pieces that may take advantage of this invention include various conductive articles such as machine tools, weaponry, recording heads, recording media, and the like.

Figure 1A:
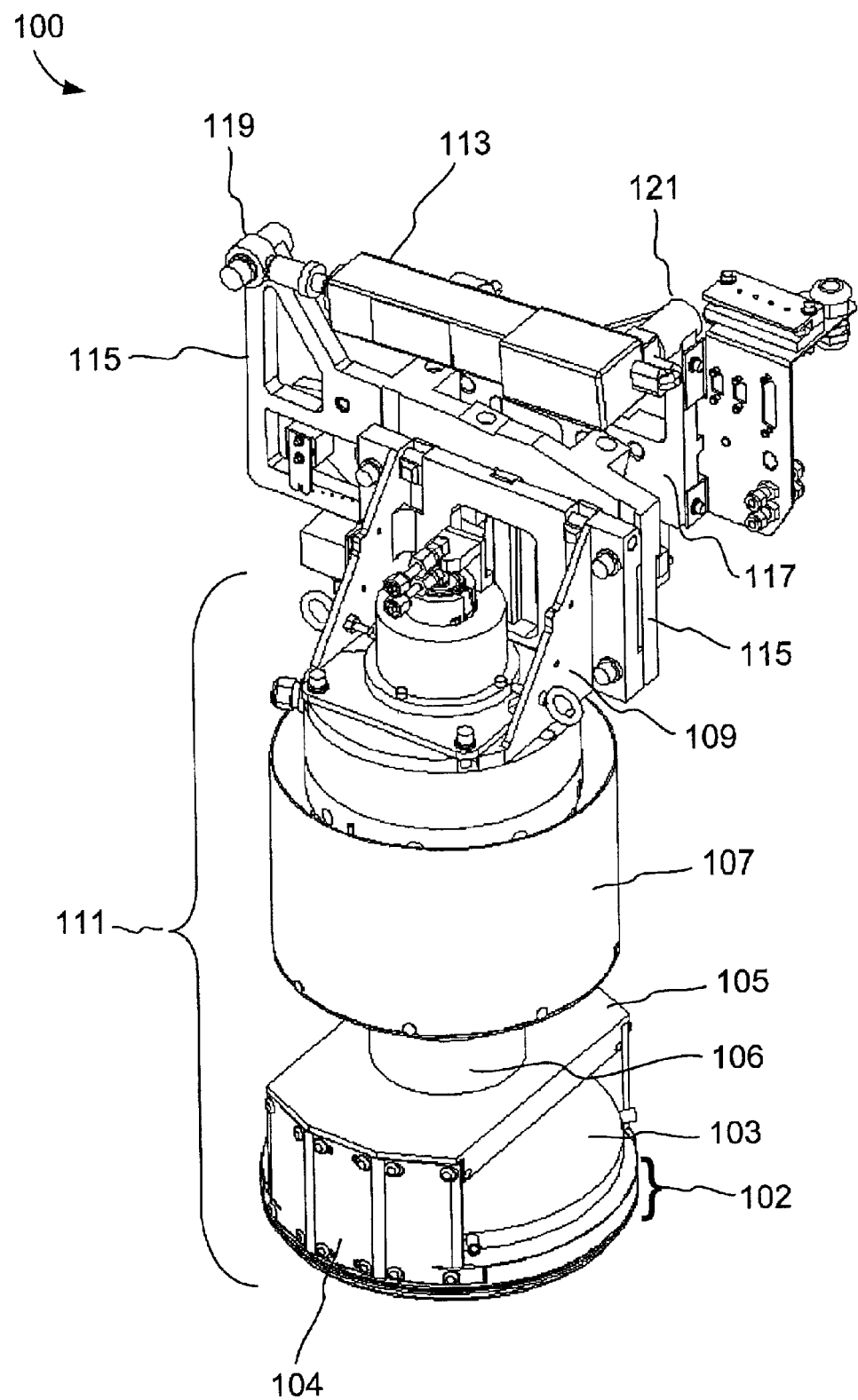
FIG. 1A depicts a wafer holder assembly for electrochemically treating semiconductor wafers used in conjunction with the invention.

FIG. 1A provides a perspective view of a wafer holding and positioning apparatus 100 for electrochemically treating semiconductor wafers. It includes wafer engaging components (sometimes referred to herein as "clamshell" components) that are the subject of this invention. The actual clamshell comprises a cup and field shaping element assembly 102. As will be shown in later figures, the cup portion of 102 holds a wafer, and a cone, 103, clamps the wafer securely in the cup.

Assembly 102 is supported by struts 104, which are connected to a top plate 105. This assembly (102–105) is driven by a motor 107, via a spindle 106. Motor 107 is attached to a mounting bracket 109. Spindle 106 transmits torque to a wafer (not shown in this figure) to allow rotation during plating. An air cylinder (not shown) within spindle 106 also provides vertical force to clamp the wafer between the cup and cone 103. For the purposes of this discussion, the assembly including components 102–109 is collectively referred to as a wafer holder 111. Note however, that the concept of a "wafer holder" extends generally to various combinations and subcombinations of components that engage a wafer and allow its movement and positioning.

A tilting assembly comprising a first plate 115 that is slidably connected to a second plate 117, is connected to mounting bracket 109. A drive cylinder 113 is connected both to plate 115 and plate 117 at pivot joints 119 and 121, respectively. Thus, drive cylinder 113 provides force for sliding plate 115 (and thus wafer bolder 111) across plate 117. The distal end of wafer holder 111 (i.e. mounting bracket 109) is moved along an arced path (not shown) which defines the contact region between plates 115 and 117, and thus the proximal end of wafer holder 111 (i.e. cup and cone assembly) is tilted upon a virtual pivot.

The entire apparatus 100 is lifted vertically either up or down to immerse the proximal end of wafer holder 111 into a plating solution via another actuator (not shown).

Thus, a two-component positioning mechanism provides both vertical movement along a trajectory perpendicular to an electrolyte and a tilting movement allowing deviation from a horizontal orientation (parallel to electrolyte surface) for the wafer (angled-wafer immersion capability). A more detailed description of the movement capabilities and associated hardware of apparatus 100 is described in U.S. patent application Ser. No. 09/872,341, now U.S. Pat. No. 6,551, 487 previously incorporated by reference.

Note that the apparatus 100 is typically used with a particular plating cell having a plating chamber which houses an anode (e.g., a copper anode) and electrolyte. The plating cell may also include plumbing or plumbing connections for circulating electrolyte through the plating cell—and against the work piece being plated. It may also include membranes or other separators designed to maintain different electrolyte chemistries in an anode compartment and a cathode compartment. In one embodiment, one membrane is employed to define an anode chamber, which contains electrolyte that is substantially free of suppressors, accelerators, or other organic plating additives. This embodiment is described in more detail in U.S. patent application Ser. No. 09/706,272, filed Nov. 3, 2000, now U.S. Pat. No. 6,527,920 naming S. Mayer et al. as inventors, and incorporated herein by reference for all purposes. The plating cell may also include a separate membrane for controlling electrolyte flow patterns. In U.S. Provisional Patent Application No. 60/295,116, previously incorporated by reference, a diffuser membrane is described for directing electrolyte upward the rotating wafer in a uniform front.

The following description presents the cup, cone, and field shaping assembly of the clamshell and represents a preferred embodiment of the invention. For consistency, reference numbers from FIG. 1A will be used in subsequent figures, where appropriate.

Figure 1B:
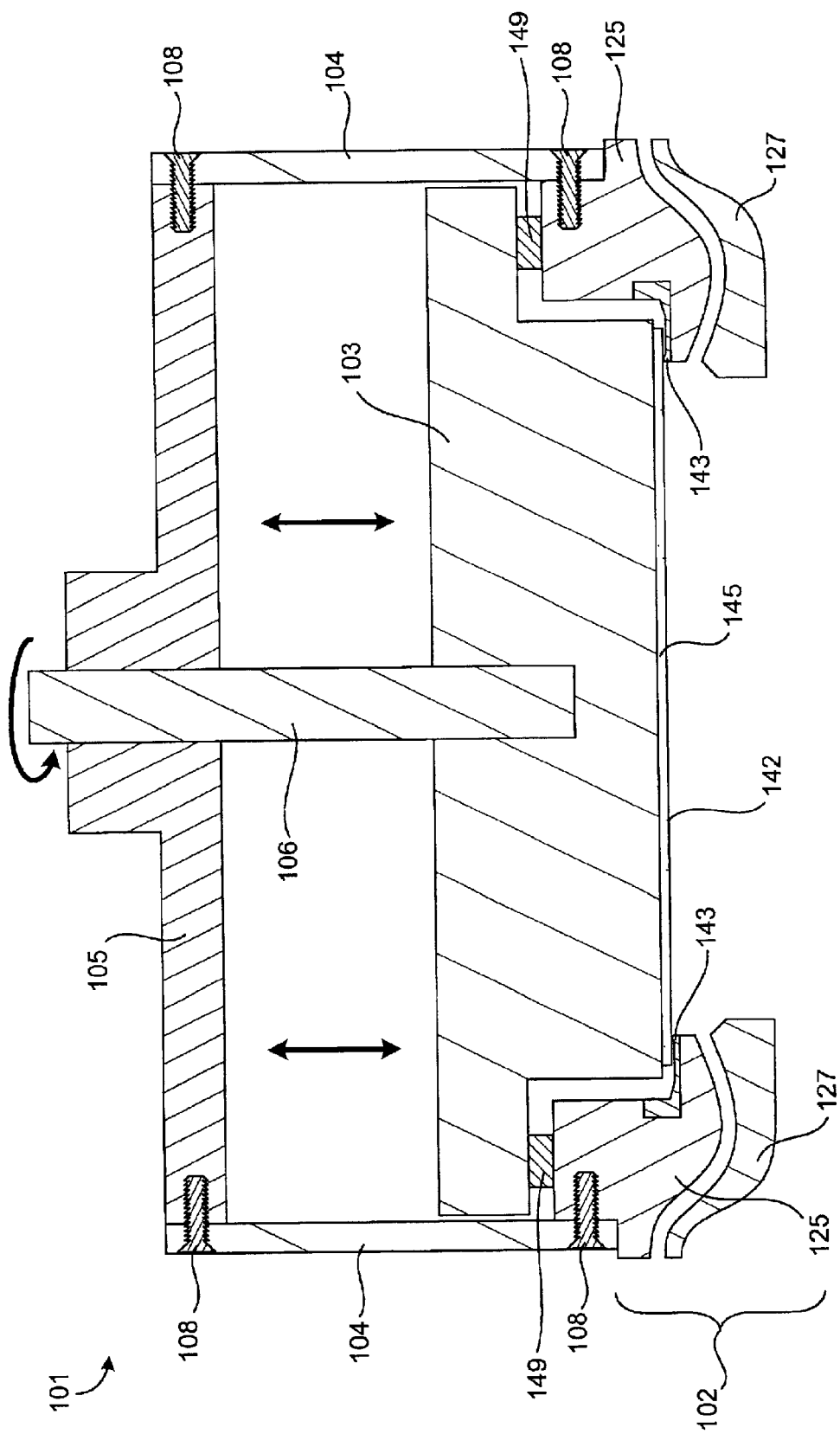
FIG. 1B depicts a cup and cone assembly of a wafer engaging apparatus.

FIG. 1B depicts a portion, 101, of assembly 100, including cone 103 and assembly 102. Note that this figure is not meant to be an absolutely accurate depiction of the cup and cone assembly, but rather a stylized depiction for discussion purposes. Assembly 102 includes both a cup 125 and a field shaping element 127. Cup 125 is supported by top plate 105 via struts 104, which are attached via screws 108. Generally, cup 125 provides a support upon which wafer 145 rests. It includes an opening through which electrolyte from a plating cell can contact the wafer. Note that wafer 145 has a front side 142, which is where plating occurs. So, the periphery of wafer 145 rests on the cup. The cone 103 presses down on the back side of the wafer to hold it in place during plating.

To load a wafer into 101, cone 103 is lifted from its depicted position via spindle 106 until cone 103 touches top plate 105. From this position, a gap is created between the cup and the cone into which wafer 145 can be inserted, and thus loaded into the cup. Then cone 103 is lowered to engage the wafer against the periphery of cup 125 as depicted.

As shown more clearly here, spindle 106 transmits both vertical force for causing cone 103 to engage a wafer 145 and torque for rotating assembly 101. These transmitted forces are indicated by the arrows in FIG. 1B. Note that wafer plating typically occurs while the wafer is rotating. If electrolyte flows upward towards the wafer, the rotation provides nearly uniform mass transfer to the wafer over the entire radial extent of the wafer.

Cup 125 has a compressible lip seal 143, which forms a fluid-tight seal when cone 103 engages wafer 145. The vertical force from the cone and wafer compresses lip seal 143 to form the fluid tight seal. The lip seal prevents electrolyte from contacting the backside of wafer 145

(where it could introduce contaminating atoms such copper directly into silicon) and from contacting sensitive components of apparatus 101. There may also be seals located between the interface of the cup and the wafer which form fluid-tight seals to further protect the backside of wafer 145 (not shown).

Cone 103 also includes a seal 149. As shown, seal 149 is located near the edge of cone 103 and an upper region of the cup when engaged. This also protects the backside of wafer 145 from any electrolyte that might enter the clamshell from above the cup. Seal 149 may be affixed to the cone or the cup, and may be a single seal or a multi-component seal. Again, this figure is a simplified depiction.

As mentioned, before initiation of plating, wafer 145 is introduced to assembly 102 when cone 103 is raised above cup 125. When the wafer is initially introduced—typically by a robot arm—it rests lightly on lip seal 143. Lip seal 143 is preferably made of an electrolyte resistant elastomer with poor bath wetting characteristics. Examples of suitable elastomers include Chemraz (GreeneTweed), Tefzel (Dupont), Kalrez (Dupont), and silicone rubber. Generally, fluoropolymers work well for this seal material.

Figure 1D:
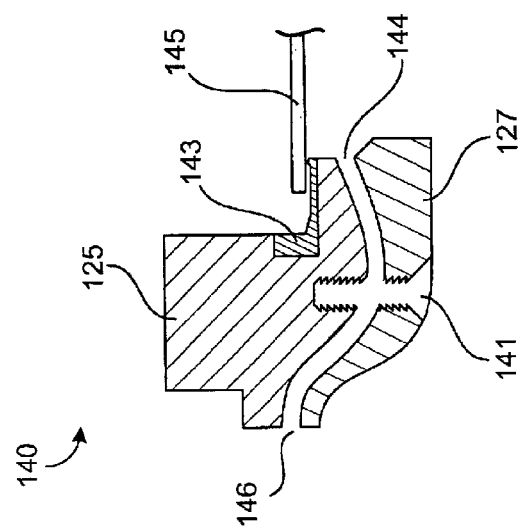
FIG. 1D is a more detailed cross sectional diagram showing how the cup and field shaping element can be fastened.
Figure 1C:
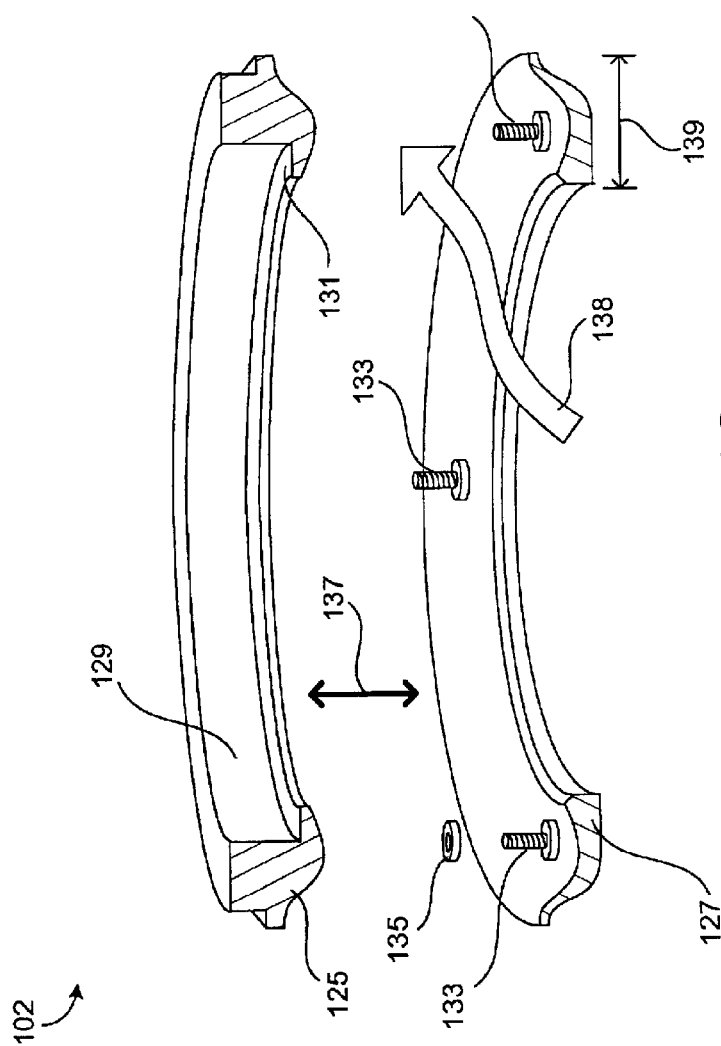
FIG. 1C depicts a cross sectional view of a cup and field shaping element used to form a flow path for plating fluid.

FIG. 1C depicts an exploded cross sectional view of assembly 102, comprising cup 125 and field shaping element 127. Cup 125 and field shaping element 127 in this case are separate elements, but they can form a unitary element (either as a monolithic whole or as separate elements bonded to one another). The components and/or combination can be fabricated by various techniques including milling and/or molding from appropriate materials. The region between these two elements defines a flow path having an inlet lower than the outlet. In the depicted embodiment, the inlet to this flow path is slot shaped, with the slot extending around most or all of the side wall of the cup. In other embodiments, the flow path may be hole shaped, oval shaped, polygon shaped, or some other shape.

In the depicted embodiment, field shaping element 127 is fastened to cup 125 by screws 133 (holes in cup 125 for receiving screws 133 are shown in subsequent figures). Although screws are used in this case, any equivalent suitable manner for fastening 125 to 127 can be used, as would be understood by one skilled in the art. Examples include clips, clamps, and various threaded mechanisms.

In one embodiment in which the assembly 102 includes separate cup and field shaping elements, the height of the flow path is adjustable. In the example of FIG. 1C, spacers 135 are used to adjust the distance 137 between cup 125 and field shaping element 127, once assembled. Spacers 135 may also protect the screws or other fastening devices used. To this end, they may be made of suitable materials that resist the highly corrosive plating solutions. In FIG. 1C, the screws 133 are depicted as each having one spacer already applied.

As shown, the cup itself (125) includes a circumferential side wall 129 defining an interior region of the cup and a lip 131, upon which a wafer (work piece) rests when placed into the cup. In this arrangement, the wafer's plating position is in the interior region defined by cup 125, with its active surface facing downward to contact the plating solution. As mentioned, a lip seal is typically used between lip 131 and a wafer to prevent backside contamination of the wafer; this will be shown in more detail below. Note also that the wafer must electrically contact a current source to maintain a potential difference between the anode and cathode (the wafer itself). In one embodiment, electrical contacts are arranged about the surface of lip 131 to provide electrical contact. In anther embodiment, electrical contact is provided through cone 103.

The dimensions of field shaping element 127 are varied according to the field shape required for particular electroplating environments. Generally, a uniform electric field across the entire wafer surface promotes uniform plating over the wafer surface. Without a field shaping element, the potential distribution (and hence the current density) will exhibit significant edge effects. In when this occurs, the current density is much greater near the edge of the wafer than in the interior regions. Field shaping elements mitigate these edge effects and promote uniform plating across the wafer surface. Together with the field shaping effects, the flow pathway provided by element 127 gives substantially improved radial and azimuthal plating uniformity.

In the depicted embodiments, the field shaping element juts into the electrolyte underneath the exposed edge of wafer 145. The presence of this material reduces the local current density at the edge of the wafer. Obviously, important parameters in field shaping include the distance that the field shaping element extends underneath the wafer edge and the distance that the element lies below the wafer surface. To this end, a width 139 of the field shaping element determines in part the current density distribution across the wafer surface. To a lesser extent, the depth (thickness) of the field shaping element in the direction away from the wafer and toward the anode causes the lines of current to straighten and reduces the current at the edge further. In the examples discussed below, various suitable shapes for the field shaping element are described.

Because the electric field distribution can vary significantly with variations in conditions such as electrolyte composition, rotation rate, etc., it may be desirable to allow end users to adjust the field shaping characteristics for their particular applications. Therefore, in one embodiment, the field shaping characteristics can be adjusted to control the electric field impinging on the wafer during plating. When cup 125 and field shaping element 127 are separate elements, this may be accomplished by interchanging various field shaping elements 127 as the needs of the system dictate. In one embodiment, various field shaping elements, each of differing width 139, may be available for substitution.

When cup 125 and field shaping element 127 are combined, flow paths are formed between screws 133, as indicated by arrow 138. As indicated, the flow path is from an inner region under the wafer edge to an outer region beyond the wafer edge. As mentioned, the flow path inlet, in this example, has a slot shape. Note that field shaping element 127 has two functions: to adjust the electric field impinging on wafer 145 during plating and to define a flow path through which electrolyte flows.

FIG. 1D shows a partial cross sectional view of an assembly 140 including cup 125 in operating position with field shaping element 127. In this figure, lip seal 143 and wafer 145 are shown. A screw (e.g., screw 133 from FIG. 1C) fastens field shaping element 127 to cup 125 as indicated by a threaded hole 141. A one or more slotted or hole shaped flow paths are formed each having an inlet 144 and an outlet 146. In the depicted operating position, inlet 144 has a lower elevation than outlet 146. This "snorkel" shape helps to reduce multiple wetting fronts during wafer immersion, as will be explained in more detail below. This design also facilitates bubble removal by taking advantage of the bubbles' buoyancy, which generally removes the bubbles from the system via outlet 146. Note again that the front side (active side) of wafer 145 is exposed to electrolyte during plating.

Figure 1E:
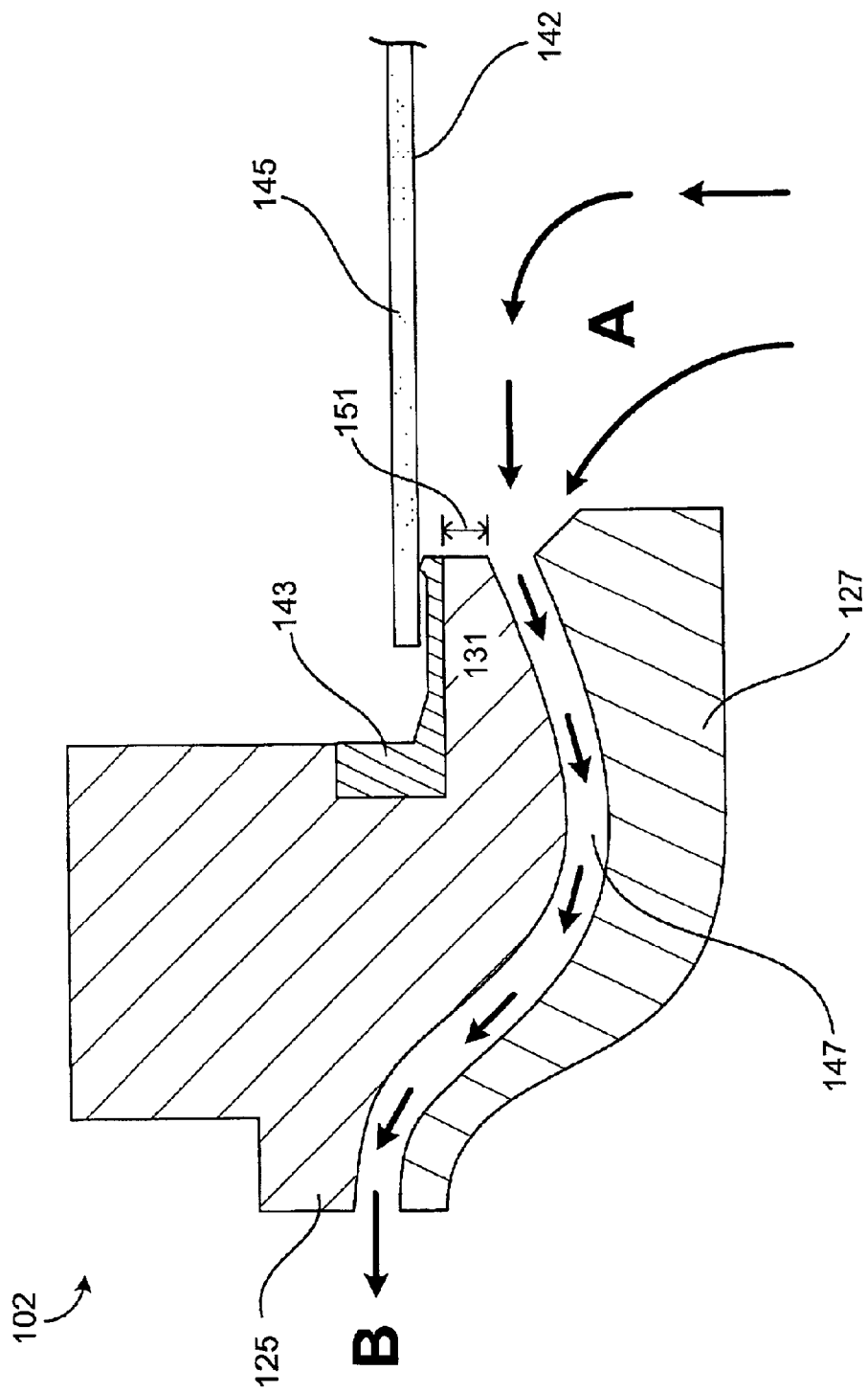
FIG. 1E depicts the flow path of plating fluid through the channel formed between the cup and the field shaping element.

FIG. 1E provides a more detailed cross sectional view of assembly 102. As illustrated, cup 125 and field shaping element 127 form a flow path 147, through which electrolyte flows. As indicated by the arrows, electrolyte approaches wafer surface 142 in an axially-oriented flow pattern and is deflected, traveling along 142, inside the local plating environment proximate to 142 (region A), and exiting to outside the local plating environment (region B) via flow path 147. Owing to the height differential between the flow inlet and outlet, gas bubbles present in the flow path (removed from region A) travel toward the outlet due to their buoyancy. To adjust the fluid velocities in the local region A, the size of flow path 147 can be adjusted using spacers or other mechanisms as mentioned above.

Note that in this embodiment, lip 131 is slightly tapered, being thinner near the flow path inlet. Immediately above the inlet, lip 131 has a thickness shown as 151. To ensure that the flow path inlet is reasonably close to wafer 145, the thickness at 151 is preferably between about 0.25 and 2.0 millimeters, and more preferably between about 0.5 and 1.25 millimeters. Preferably, the flow path length is between about 30 and 60 millimeters, and more preferably between about 35 and 50 millimeters.

The material used to form cup 125 or least the portion of lip 131 undergoing the most stress should resist deformation when the cone presses down on the wafer. In addition, the material should resist attack by plating chemicals, be non-conductive, and possess mechanical strength. As mentioned above, the classes of material that meet these needs include ceramics, (alumina, zirconia), plastics, fluoropolymer or other plastic-coated metals and/or ceramics, glasses or glass-coated metals, and composite materials.

Note that the entire cup or a portion of the cup can be made of ceramic. In one case, zirconia or alumina is the ceramic of choice. In this case the material thickness is typically 0.04 inches at its thinnest point 151, and increases to a minimum of about 0.1 inches at an angle of approximately 45 degrees. Beyond this point the shape of the channel can be straight, tapered downward and then upwards (snorkel design) or straight and then upwards. FIG. 1F shows an alternative embodiment in which the channel is straight (rather than descending) immediately beyond its inlet.

The design of flow path 147 also takes into account the potential for defect formation caused by poor wetting of the wafer edge. The ultimate goal of the immersion process is to create a single wetting front. Thus as described in reference to FIG. 1A, the invention can pivot the work piece about an axis defined on or proximate the work piece. Rotating a wafer and having it enter the bath at an angle helps to reach this goal. However, the existence of the flow slot enables two possible wetting fronts on the wafer: back flow through flow path 147, and flow over and around field shaping element 127. Through invention of novel combination of entry angle, entry speed (z-speed) and rotation rate (as discussed in U.S. patent application Ser. No. 09/872,341, now U.S. Pat. No. 6,531,487, previously incorporated by reference) together with a snorkel flow path design, wetting front related defects associated with wafer entry can be virtually eliminated. Specifically, the snorkel design can nearly eliminate back flow.

Figure 2A:
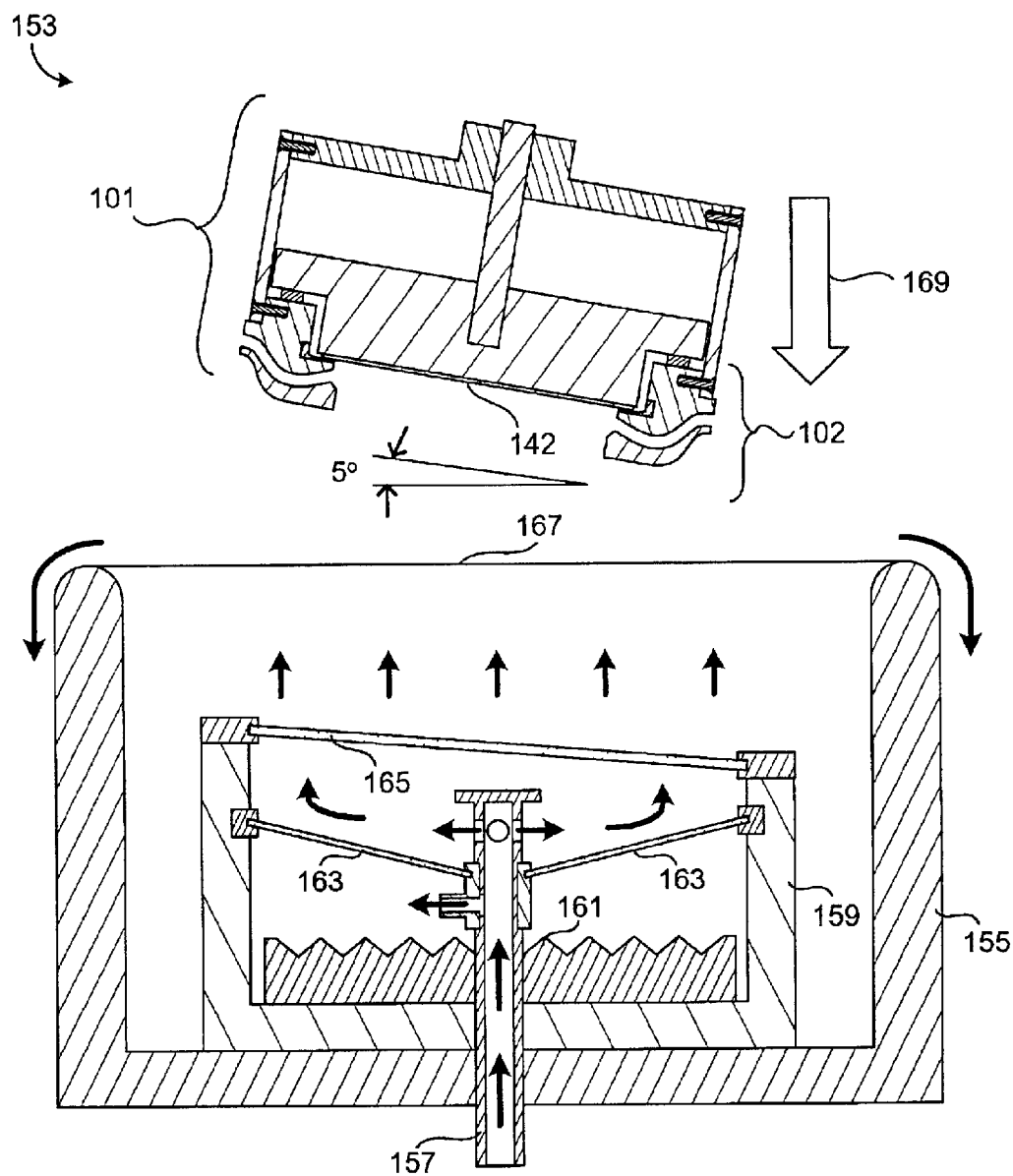
FIGS. 2A–D depict an improved wafer engaging and positioning device in relation to the plating cell environment.

FIG. 2A depicts a wafer immersion scenario 153 in which assembly 101 is lowered into a plating chamber 155. In chamber 155, electrolyte first enters an anode chamber 159 via a conduit 157. Anode chamber 159 includes a copper anode 161, appropriate flow ports from conduit 157, and a filter membrane 163. The filter membrane 163 can maintain separate electrolyte chemistries in the anode chamber 159 and the remainder of the plating chamber. In other words, separate chemistries can be maintained for an "anolyte" and a "catholyte." In a preferred embodiment, membrane 163 is permeable to water and ionic components but impermeable to organic components such as suppressors and accelerators. Those of skill in the art will understand how to design and maintain such membranes. See U.S. patent application Ser. No. 09/706,272 now U.S. Pat. No. 6,527,920, in this regard.

As shown, chamber 155 also includes a flow diffuser 165 used to achieve a homogeneous axial electrolyte flow across the radius of wafer surface 142. The dark vertical arrows indicate this effect. Electrolyte enters the cathode chamber via an outlet hole in near the top of conduit 157. Electrolyte exits plating chamber 155 by flowing over the walls of 155 (a weir) and is there collected for recalculation. The use of a diffuser and other features used to control the axial distribution of electrolyte flow in the chamber are described in more detail in U.S. Provisional Patent Application No. 60/295,116, previously incorporated by reference.

Figure 2B:
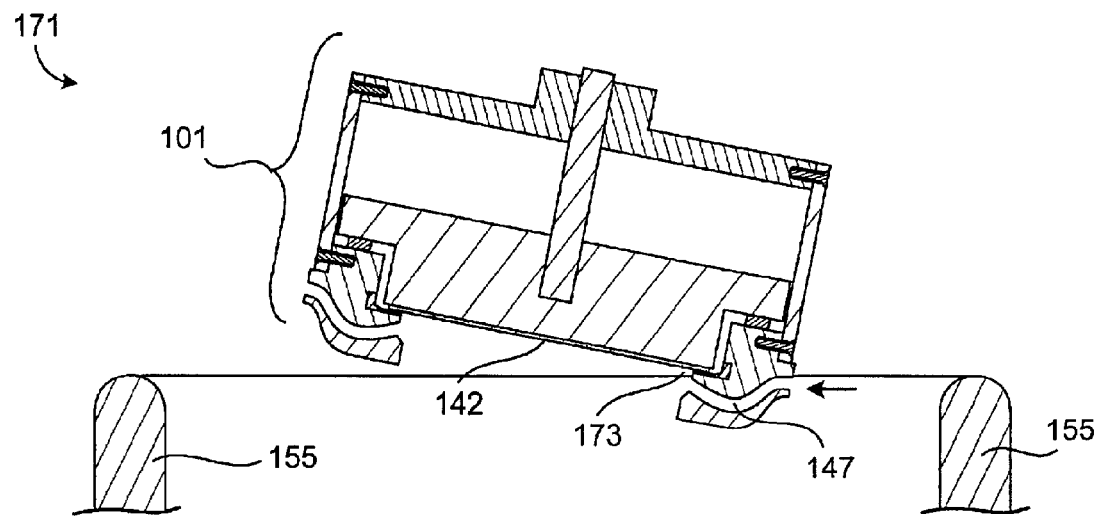
Figure 2C:
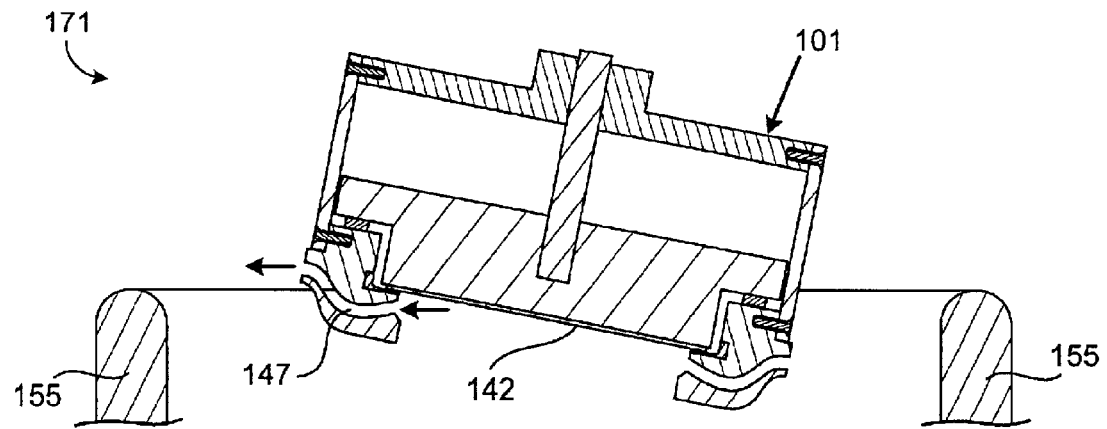

Assembly 101 is tilted before entry into the electrolyte. In a specific example, the angle defined by the surface of the wafer 142 relative to the surface of the electrolyte 167 is about five degrees. When assembly 101 is immersed in the electrolyte, as indicated by arrow 169, the shape and design of assembly 102, comprising the cup and field shaping element, allow for minimal wetting fronts as mentioned above and depicted in FIGS. 2B and 2C (scenario 171). First referring to FIG. 2B, as assembly 101 is immersed in electrolyte 167, the electrolyte enters the outlet (via back flow) of flow path 147 as indicated by the arrow. As mentioned, the snorkel design allows for only one wetting front, which starts at point 173, where electrolyte surface 167 first contacts wafer surface 142. Next, referring to FIG. 2C, as assembly 101 is further immersed into electrolyte 167, the electrolyte wetting front moves along the wafer surface 142 (from right to left as depicted) and entering flow path 147 through the inlet and exiting through the outlet (forward flow), as indicated by the arrows. Thus a combination of angled entry and flow path design allow for efficient wetting and subsequent fluid flow control during plating.

Figure 2D:
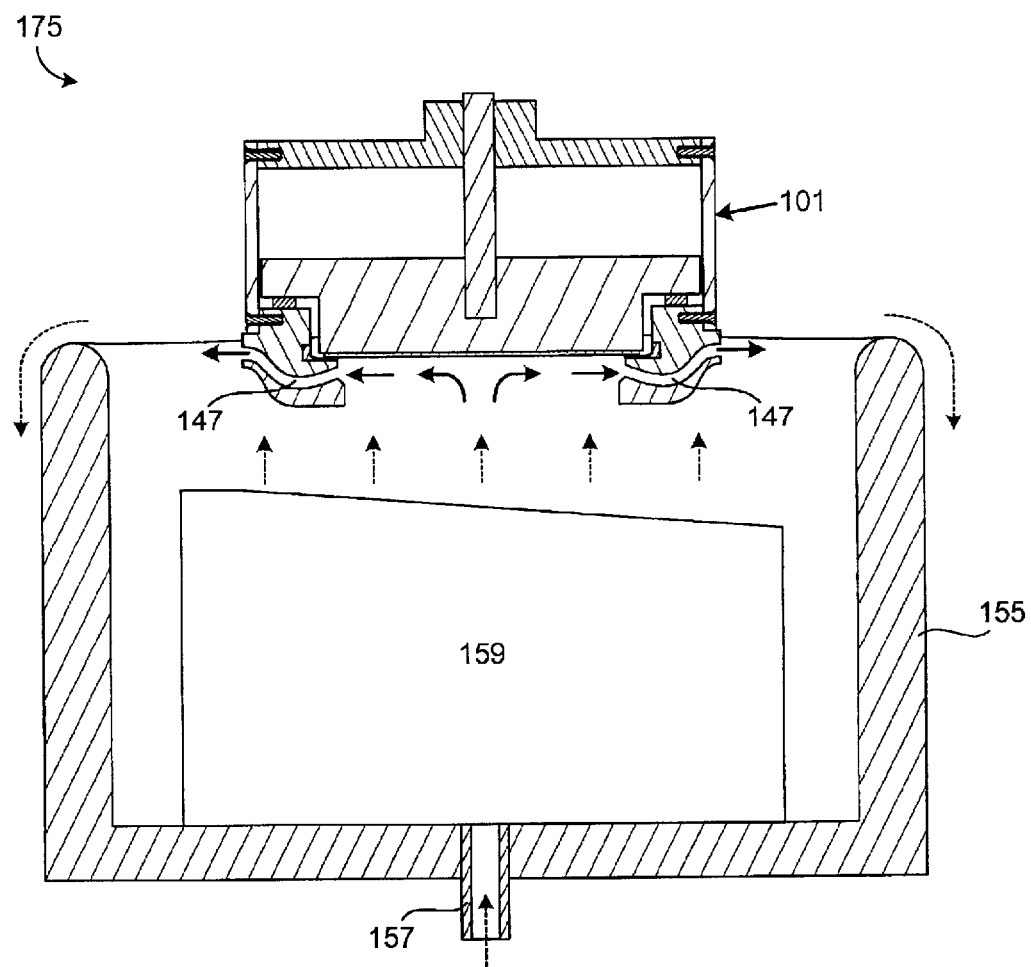

FIG. 2D, depicts a plating scenario 175 for an improved apparatus of this invention. For clarity, details of anode chamber 159 are not shown. Again, electrolyte enters plating chamber 155 via anode chamber 159, which provides a uniform axial flow of electrolyte to the wafer surface, as indicated by the dashed-line arrows. In this case, assembly 101 has been tilted back to horizontal (subsequent to angled immersion as in FIGS. 2B–C) for horizontal plating. In some instances angled plating is preferred. Anode chamber 159 is designed with this in mind, as is reflected its angled top surface. As indicated by the dark arrows, once the cup and field shaping element assembly is immersed, electrolyte flows upon the wafer surface and radially outward, exiting through flow path 147.

Figures 3A, 3B:
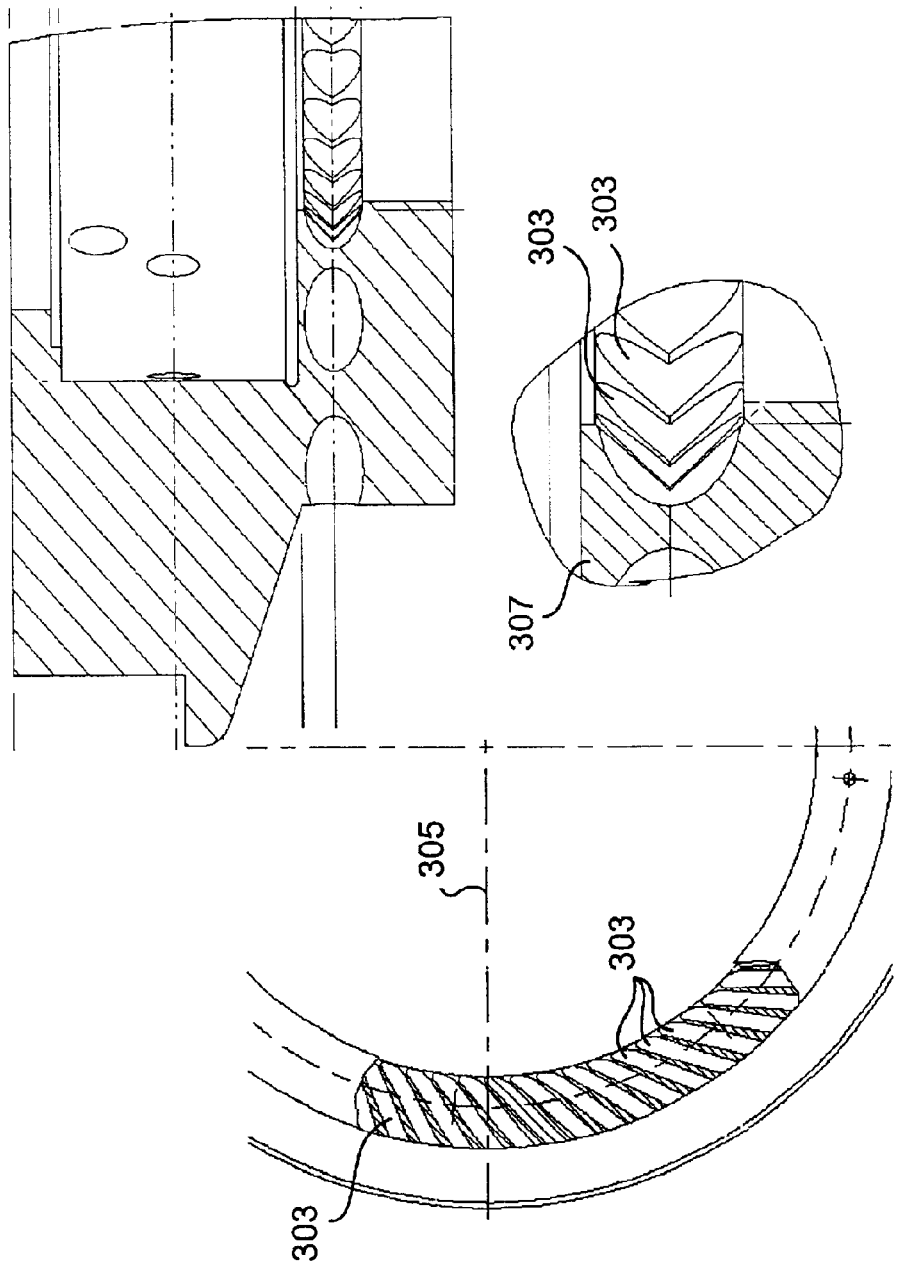
FIGS. 3A and 3B depict an alternative embodiment in which the flow path inlets through a cup are hole shaped.

FIGS. 3A and 3B depict an alternative embodiment in which the inlet to the electrolyte flow path is provided as holes rather than a slot (or slots). Note that the depicted inlet design is preferably, though not necessarily, used with a snorkel type flow path as described above. FIG. 3A is a top view cross-section showing that flow path holes 303 provide a path at an angle offset from the direction of a radial vector (e.g., line 305). FIG. 3B shows the inlet angles for a series of flow paths 303.

As shown, flow holes 303 are provided beneath the lip 307 of a cup. In the depicted embodiment, the holes are angled away from the radial direction toward the direction of rotation. These flow holes more closely match the natural flow pattern of the rotating fluid. Preferably, the offset from the radial direction is between about 25 and 50 degrees. In a specific embodiment, the direction of the holes is about 45 degrees with respect to the radial vector.

Also, in order to smooth out the azmuthal and axial velocity variations in front of the holes, a grooved channel inlet may be employed (see FIG. 3B). In a specific embodiment, a "v" grove is used at the flow hole entrances. The design of these holes allows plating fluid to pass through the cup near the wafer surface and without being substantially redirected over the cup's electric field shaping wall and field shaping insert. This facilitates the removal of bubbles from under the wafer on entry into the bath. It has been found that changes to inlet shape and direction improve the edge plating uniformity.

EXAMPLES

Example 1

Various fluid flow models have been developed and run. In this example, the model results are provided at the corner where the wafer meets the edge of the cup. It is possible that variations in axial velocity cause deposition non-uniformity near the edge of the wafer. This example describes a model of a wafer holding device, which has a continuous curved slot through the clamshell.

Figure 4A:
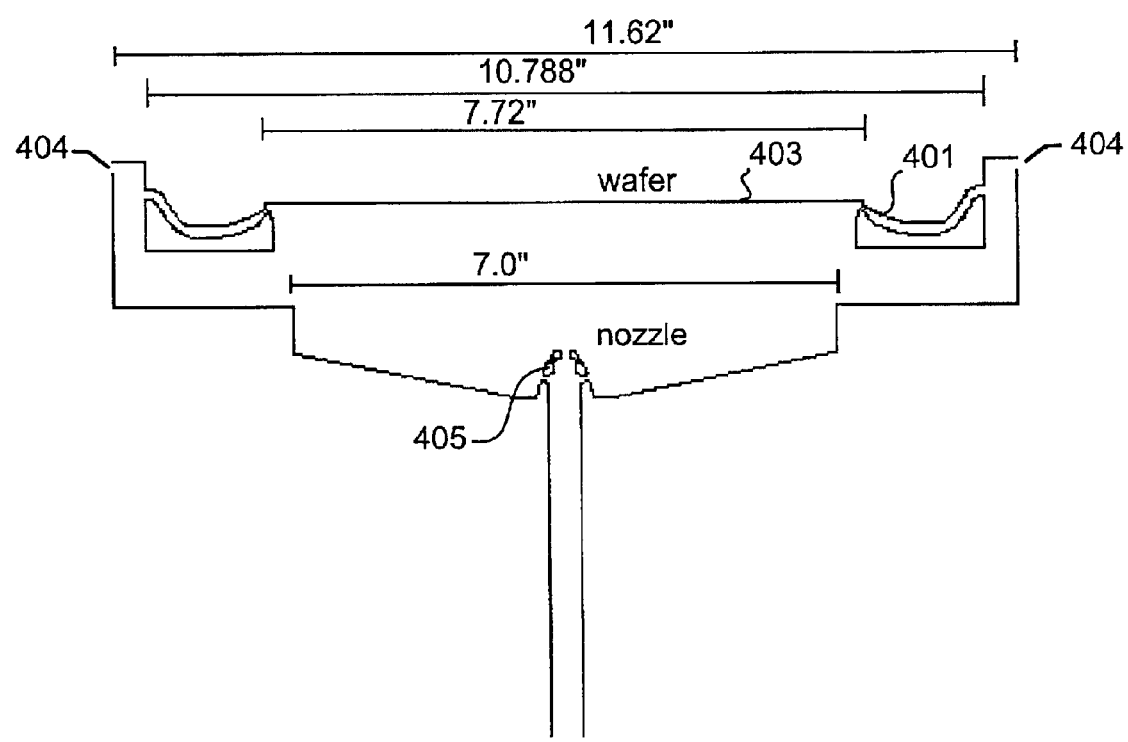
FIG. 4A shows a plating cell geometry used to model an axial velocity distribution over the face of a wafer.

The plating cell geometry for the model is given in FIG. 4A with the key diameters marked. Since the channel is a slot that runs all the way around the clamshell, the cell was modeled as a two-dimensional axisymmetric system. As shown, a slot 401 begins slightly below a wafer surface 403 at a radius of 3.36 inches (98 millimeters. 7.72 inch diameter as depicted). The entrance to the slot is angled up toward the surface of the wafer and the bottom of the field shaping element has an inner radius of 95 mm (7.0 inches as depicted). The overall clamshell radius is 5.394 inches (137 millimeters, 10.788 inch diameter as depicted). The clamshell holds the wafer in the plating bath and the entire assembly rotates in the bath at a speed of 125 rpm. The outer radius of the cell is reduced with a conversion ring so that the overall cell radius for 200 mm application is 5.81 inches (148 mm, 11.62 inch diameter as depicted). Flow outlet 404 is through the opening on the top of the outer edge of the cell.

Figure 4B:
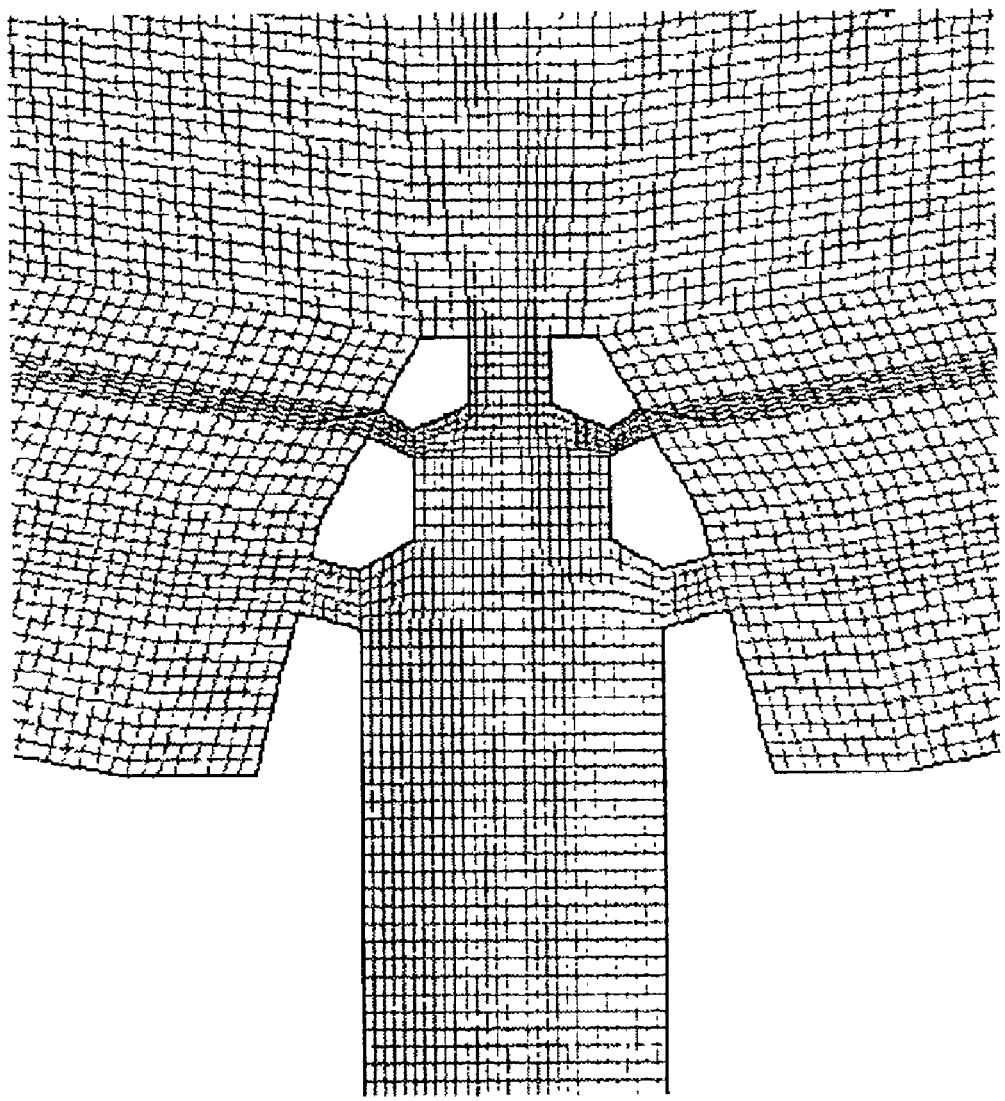
FIG. 4B shows the grid elements used for the model of FIG. 4A in the vicinity of a plating fluid outlet nozzle.

The process fluid was approximated as water. The water flows in through the pipe at the bottom of the cell and through a nozzle 405. The nozzle has three rows of holes in that are approximated as slits in two dimensions so that their areas are the same as the sum of the areas of the holes in the corresponding row. Thus, each slit is narrower than the diameter of each hole in the actual row of the nozzle. The grid in the vicinity of the nozzle, showing these slits, is shown in FIG. 4B.

The water mass flow rate into the system was 6 liters per minute, which corresponds to a velocity of 1.03 m/s. The water flow was turbulent and a standard k-ε turbulence model was used with a turbulence intensity of 2%.

The pressure contours through the clamshell were shown to be fairly uniform in the flow cross-section through the length of the slot. The model results showed no recirculation loops within the slot, unlike the case of a straight through hole, particularly near the entrance to the hole. Calculated velocity vectors in the entry region of the slot show that at the corner of the wafer, some flow is away from the wafer toward the slot.

Figure 5A:
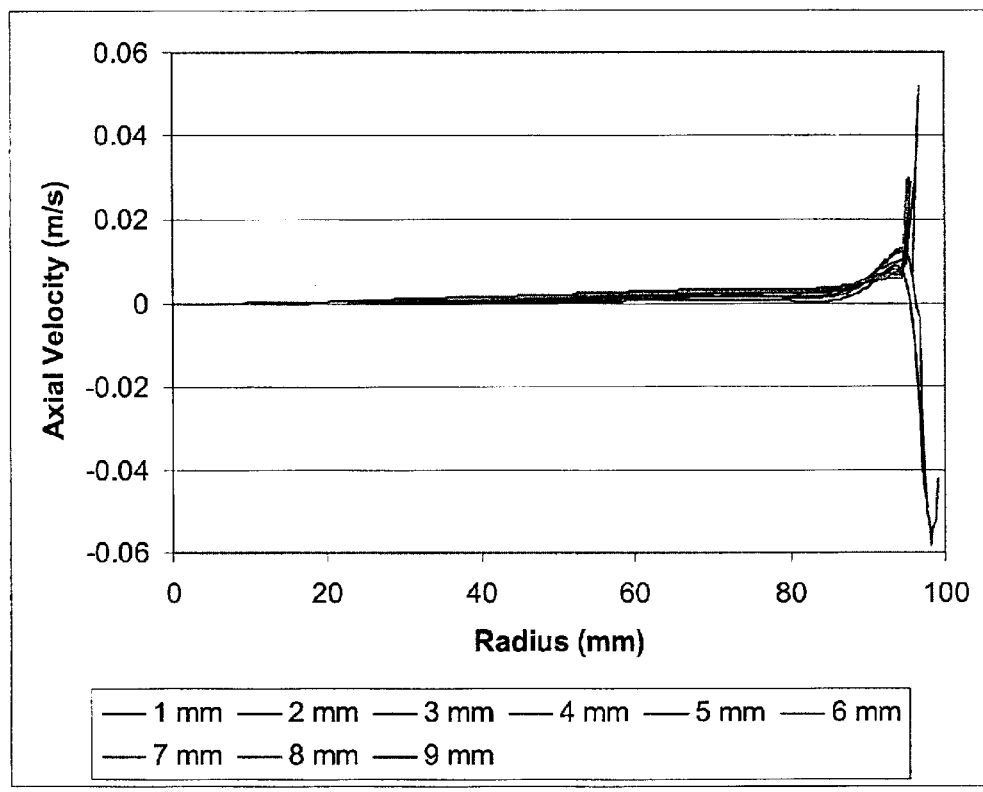
FIG. 5A is a plot of axial velocity as a function of cell radius predicted by the model of FIG. 4A.
Figure 5B:
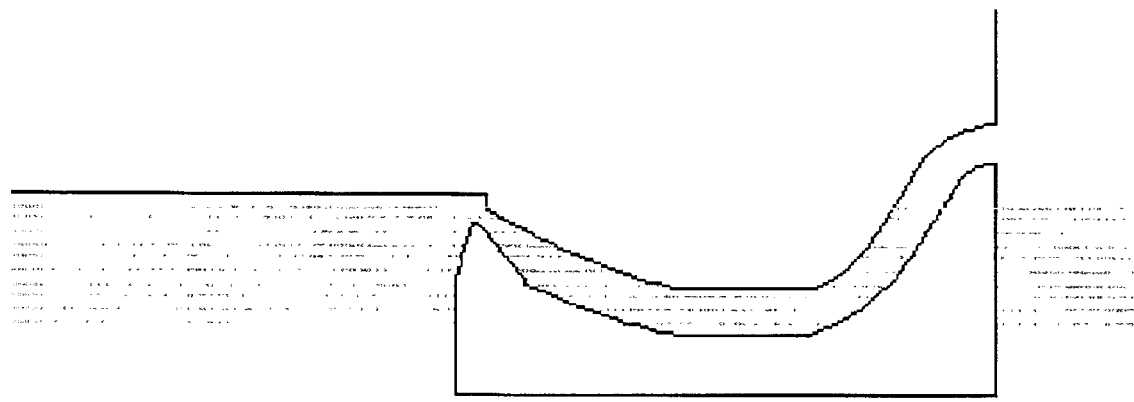
FIG. 5B shows the location of the lines, for use with the above model, at 1 millimeter increments from the surface of the wafer.

Of particular interest is the axial flow at various distances from the wafer. The axial velocity is the velocity toward the wafer and away from the nozzle. Positive axial velocity means copper ions and additives are being carried to the wafer surface where they mitigate plating of the wafer. FIG. 5A is a plot of axial velocity as a function of cell radius. The plot gives this information at various distances from the wafer, up to 9 millimeters away. FIG. 5B shows the location of the lines at 1 millimeter increments from the surface of the wafer.

Figure 5C:
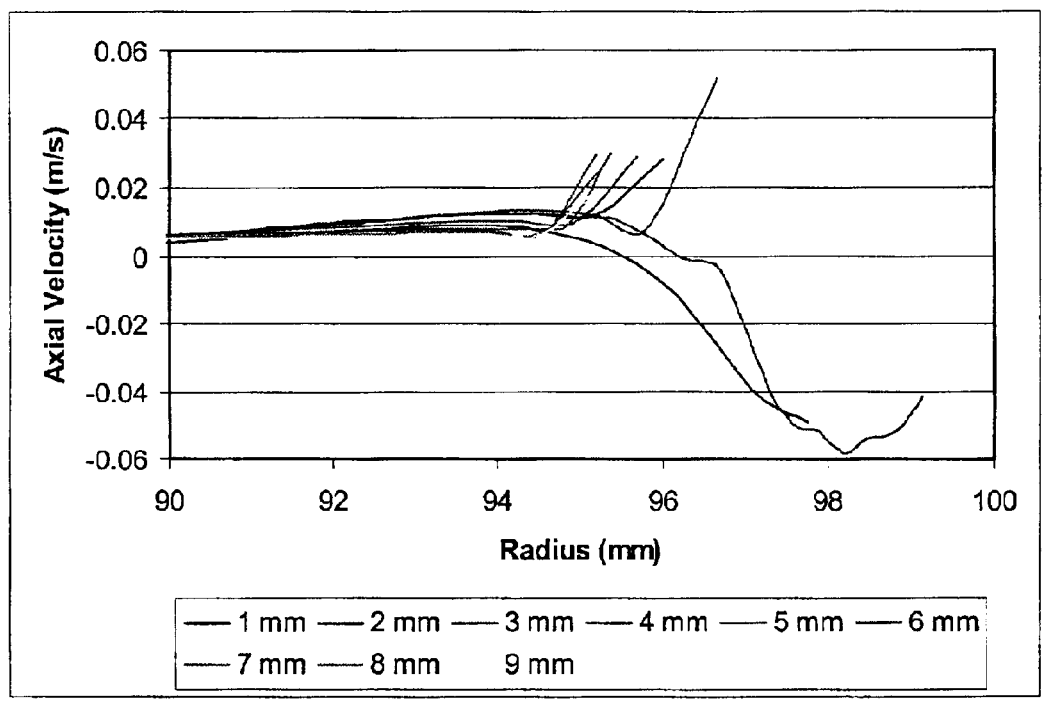
FIG. 5C shows axial velocity data generated by the above model for the outer 10 millimeters of the wafer.

The axial velocity is small and nearly constant over the length of the wafer until reaching a radial position of about 90 millimeters. FIG. 5C shows the axial velocity data for the outer 10 millimeters of the wafer. Since the inner wall of the clamshell does not have a uniform radius at different distances from the wafer, each curve on the following plot does not end at the same radial position. The radius 1 millimeter away from the wafer is 98 millimeters. The data on the plot goes into the channel 2 mm away from the wafer. The radius 9 millimeters away from the wafer is 95 mm.

In general, the model results show a non-uniformity of axial velocity beyond a radius of 95 millimeters. This change in axial velocity is a result of the fluid directing itself toward the channel inlet.

Figure 6:
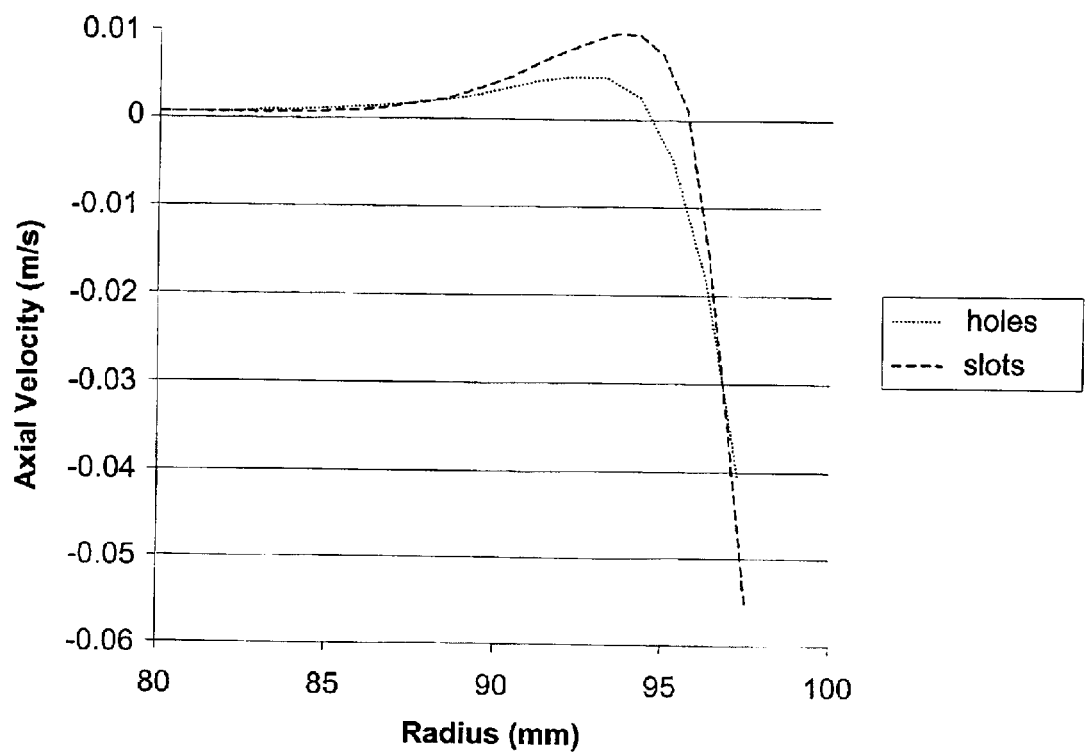
FIG. 6 is a plot comparing the axial velocity profile 1 millimeter away from the wafer surface for slotted and hole-inlet wafer holders.

The axial velocity profile for the slotted design does not differ significantly from that of the hole design. FIG. 6 shows a plot comparing the axial velocity profile 1 millimeter away from the wafer surface. Both systems exhibit a slight increase in axial velocity outside a radius of 85 mm which is followed by a drop to negative axial velocities above a radius of 95 mm.

Figure 7:
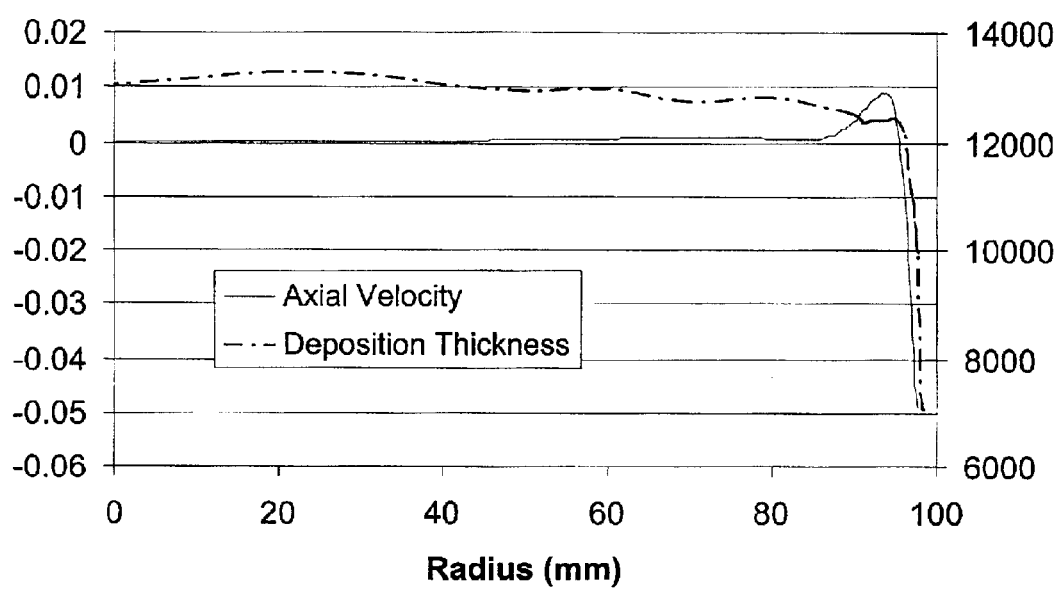
FIG. 7 shows the experimental deposition thickness data plotted next to the data for axial velocity from the above model.

Experimental data of film deposition thickness shows a decrease at the outer edge of the wafer. FIG. 7 shows the experimental data plotted next to the data for axial velocity from this model. In this example, axial velocity tracks very well with the decreasing deposition thickness. The downturn in axial velocity and deposition rate occurs at the location which corresponds to the inner radius of the cup below the channel, that is, the lip portion of the cup below the wafer.

Example 2

Modeling work showed only slight difference in axial velocity distribution between clamshell designs using slot flow paths and hole flow paths. The ideal case would be to have completely uniform axial velocity along the diameter of the wafer. The purpose of further modeling effort was to see if the difference between the two flow profiles is related to the shape of the wall under the outer edge of the wafer and to try to model the transport of species to the surface. The shape of the wall corresponds to the field shaping element of the clamshell. This work showed that when the channel through the clamshell was made wider, improved edge uniformity was observed. Still further, models tested the effect of various channel designs with the goal of minimizing non-uniformity near the edge of the wafer, thus allowing an increase in the area of the wafer which is usable after electroplating.

Figure 8:
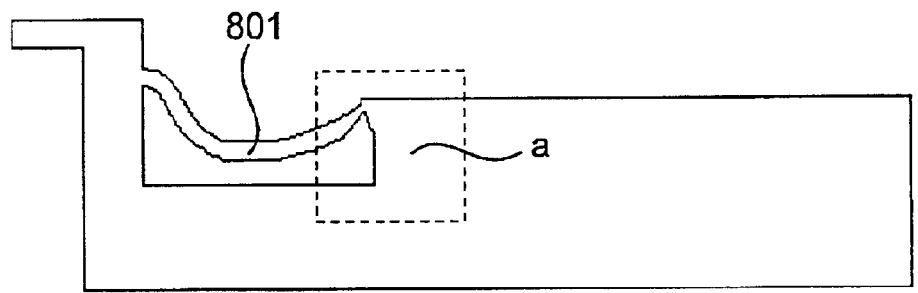
FIG. 8 shows the original geometry with a snorkel channel used in a second model to determine the effect of changing the field shaping element below the flow path inlet.
Figure 8A:
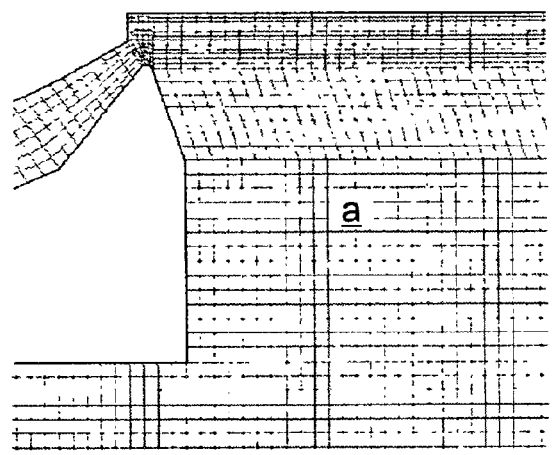
FIGS. 8A–8E detail the geometries at the entrance to the channel for five separate inlet geometries.
Figure 8B:
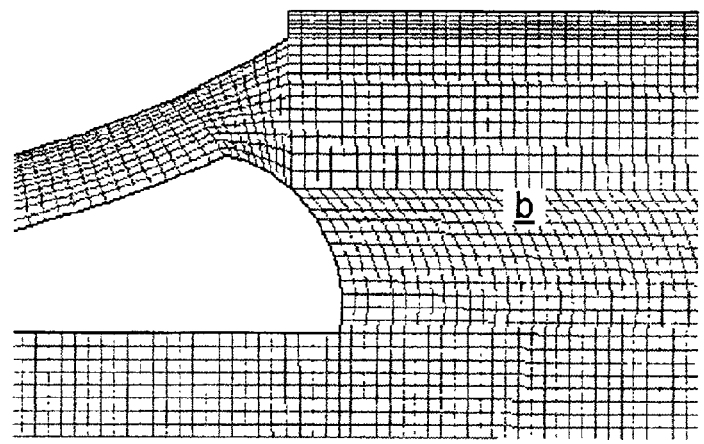
Figure 8C:
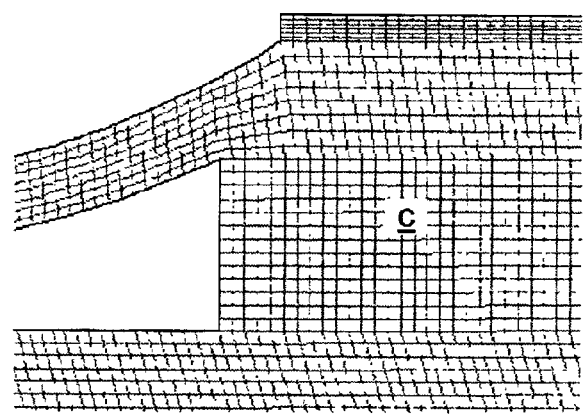
Figure 8D:
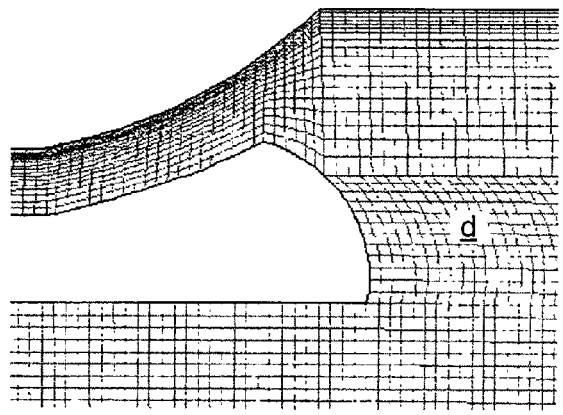
Figure 8E:
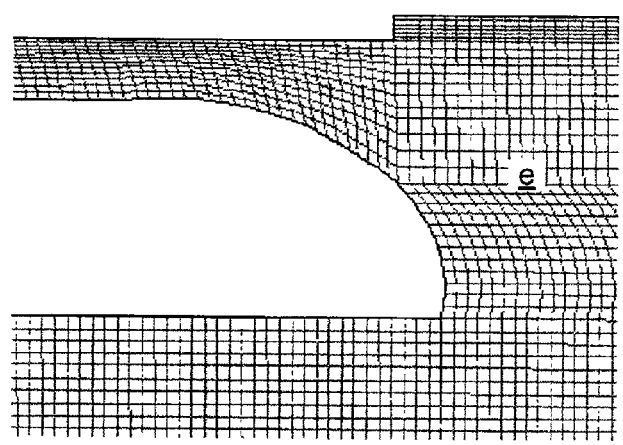

The space between the diffuser plate and the wafer was modeled in Fluent, made by Fluent, Inc. of Lebanon N.H., using a two-dimensional axisynmmetric geometry. The wafer and diffuser are assumed to be horizontal; the three-degree angle at which they may be placed in actual use makes no difference in the modeling results. The wafer and clamshell are rotating at 125 rpm. This results in turbulent behavior inside the cell. The standard k-ε model was used with the two layer zonal model for near-wall treatment. The grid near the wafer and through the clamshell channel is very fine, helping with convergence and accuracy of the two layer zonal model. FIG. 8 shows the original geometry with a u-shape (snorkel) channel, 801. A close-up of the entrance to the channel (the region marked by the dotted square) is the design labeled a). Four other designs were modeled. Each of the five designs are labeled a–e respectively) in FIGS. 8A–E.

The clamshell/wafer intersections in the designs modeled occur at the same radius, 98 mm. The first four designs (a–d) have the same overall channel shape except for the entrance. The last design (e) is a more radical departure from the basic design, with a straight channel all the way through the clamshell. Design (d) has a knife-edge contacting the wafer. This was modeled to act as an ideal case, with the least intrusion into the plating bath. The fine mesh near the wafer and through the clamshell is evident in FIG. 8. There are 6 cells between the wafer surface and the top corner of the channel. There are 6–9 cells across the channel.

Figure 9:
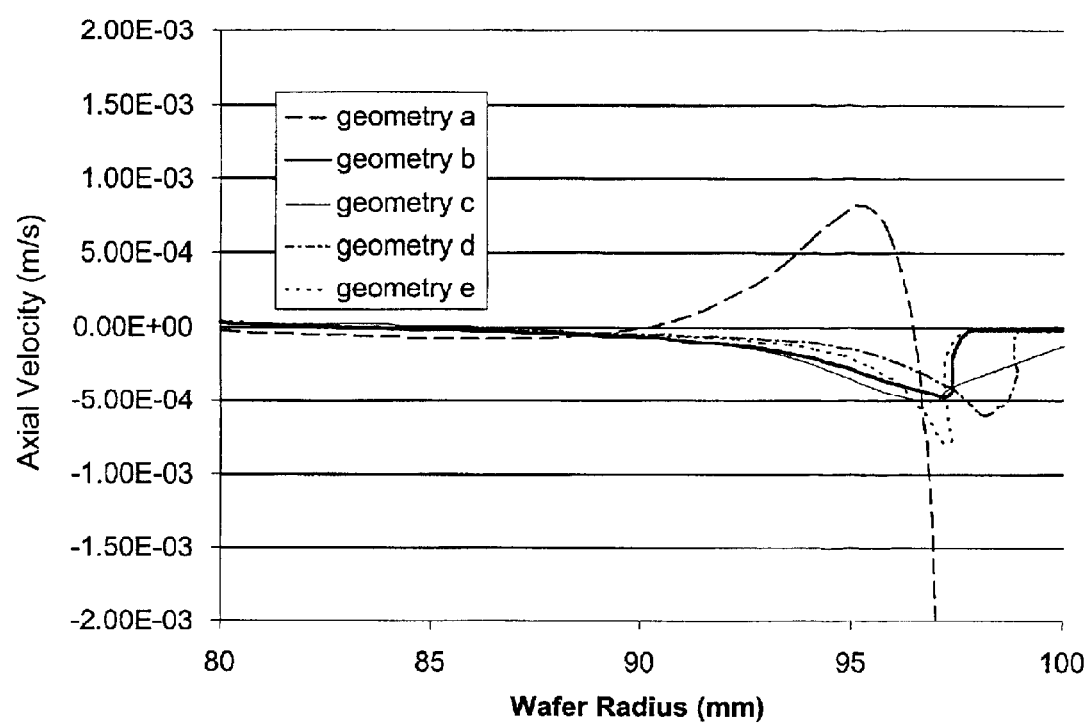
FIG. 9 shows a plot of axial velocity as a function of wafer radius at a distance of 1 mm from the wafer surface for each of the five geometries in FIGS. 8A–8E.

The value of interest is the axial velocity near the wafer. FIG. 9 shows a plot of axial velocity as a function of wafer radius at a distance of 1 mm from the wafer surface. The x-axis is blown up to show the results between 80 and 100 mm, as this is the region where the differences occur. Of all the designs tested, only the original design (a) has the hump in axial velocity ahead of the negative velocities representing some flow away from the wafer surface. In fact, the original design gives a slightly negative axial velocity all the way back to 80 mm. On the other extreme, design (d) is the ideal knife-edge system. The axial velocity remains constant longest in this case, and the negative velocity is less significant. The negative velocity cannot be eliminated completely as long as the flow has to head into a channel that is not open all the way to the wafer surface. The design that comes closest to the ideal is the one with the straight channel. This is because the other channel designs require the flow to head away from the wafer immediately after entering the channel.

Designs (b) and (c) are also decent alternatives to the original design. The difference between these two geometries is that the innermost part of the clamshell has been chopped off in design (c). This doesn't appear to make a significant difference in the flow behavior near the wafer.

This modeling indicates that minor changes to the inner portion of the clamshell can have a significant effect on the flow patterns near the wafer and may enhance deposition uniformity at the outer edge of the wafer. If the u-shaped channel is no longer necessary to ensure bubble breakup at the surface of the wafer, changing to a straight channel appears to give a good flow profile. Most importantly, the entrance to the channel must be widened to allow for smoother flow through the clamshell. Any of the alternative designs modeled in this example serve to eliminate the hump in axial velocity just before the wafer edge and keep the flow directed toward the wafer over more of the wafer surface.

Example 3

This example supplements the previous example by giving the results for one additional geometry, that of the original design with the channel opened up by 0.1". In other words, the cup and field shaping elements were further separated to widen the flow path channel. The basic geometry and modeling parameters are identical to that described in Example 2. The new, wider inlet case will be referred to as case (f).

Figure 10:
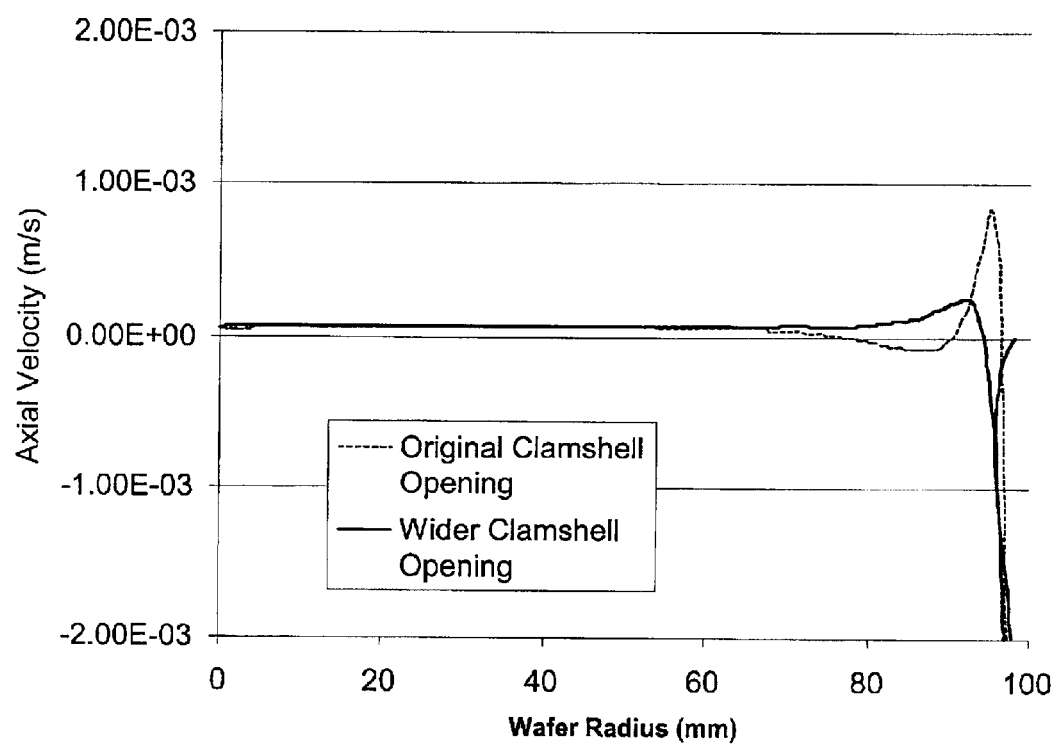
FIG. 10 shows a plot of predicted axial velocity as a function of wafer radius at a distance of 1 millimeter from the wafer surface for an original geometry and one in which the flow path is slightly wider.

FIG. 10 shows a plot of axial velocity as a function of wafer radius at a distance of 1 millimeter from the wafer surface for two cases, (a) and (f). These are the original design and the widened channel design, respectively. The widened channel reduces the size of the hump in axial velocity and also eliminates negative axial flow before the hump. However, there is still a significant negative axial velocity just before the entrance to the channel. And the region of non-uniformity is about the same length as that in the original slotted design.

In conclusion, modifying the slotted clamshell design by opening up the channel by 0.1 inches does reduce the magnitude of the non-uniformity near the edge of the wafer, but does not reduce the fraction of the wafer under the influence of non-uniform flow.

Example 4

The six cases (a–f discussed above) were modeled by looking at the seed layer deposition rate. The model calculated the secondary current distribution including the terminal effect using CFD-ACE software, made by CFD Research Corporation of Huntsville AL. The results are steady-state and only show the current density at the wafer surface at the onset of plating in the cell. The goal was to see how design modifications effect the deposition rate on the wafer.

Figure 11:
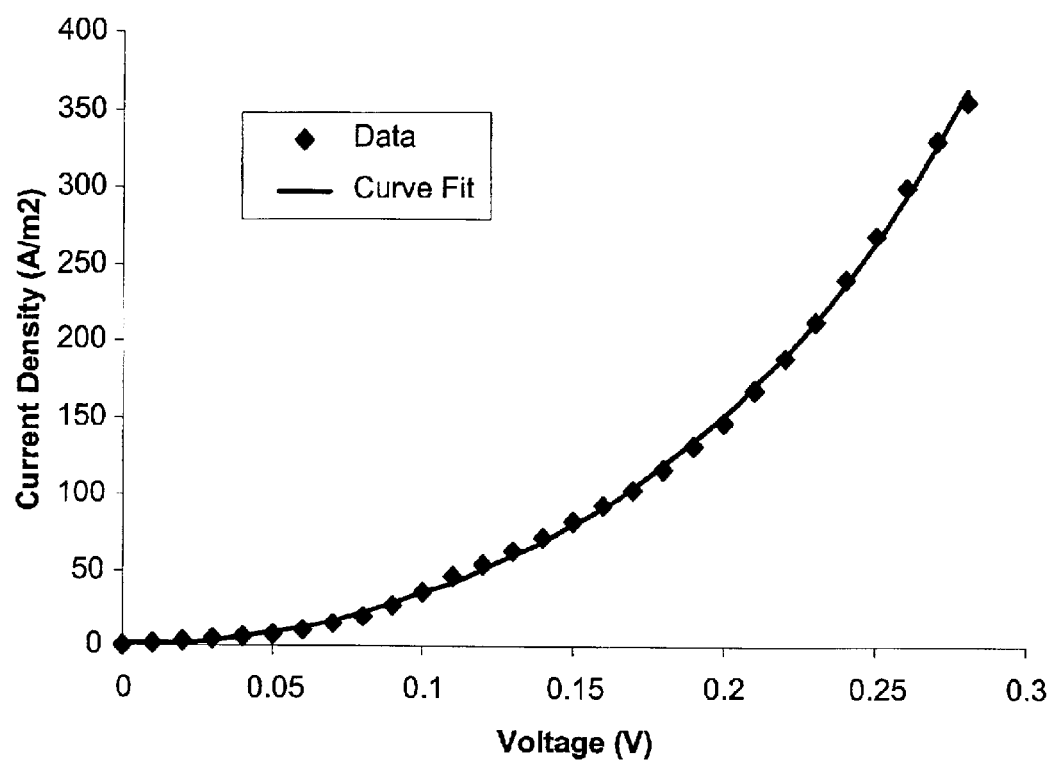
FIG. 11 shows a plot of Tafel layer polarization data and a $5^{th}$ order polynomial curve fit to that data for use in a model of secondary current distribution.

In this example, the model did not account for fluid flow, and hence, it was assumed that the electrolyte and bath additives were always well mixed. The Tafel layer polarization curve used in the model was derived from data for the enthrone bath chemistry. The data and a $5^{th}$ order polynomial curve fit to that data are shown in FIG. 11. The curve fit was used in the model.

The idea behind this work was to compare and contrast the fluid flow results and electrical current flow results, as well as to examine the deposition rate on the wafer. The deposition rate is proportional to the current flux, and plots of current flux are shown for all the cases. The six geometries are investigated for initial seed layer thicknesses of 500, 100, and 10,000 Angstroms. Note that seed layers are thin layers of copper deposited on the wafer active surface prior to electroplating. They provide a conductive surface on which the plating can occur. Often they are deposited by physical vapor deposition.

Figure 12A:
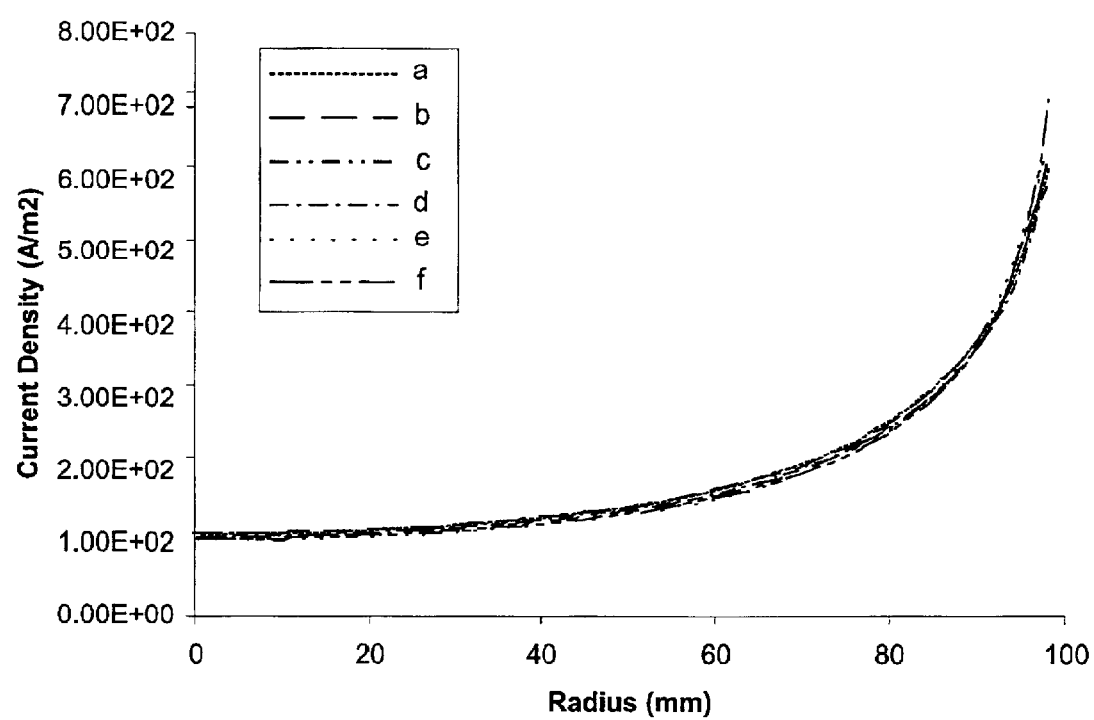
FIGS. 12A–C show that the secondary current density calculated in the absence of fluid flow for different seed layer thicknesses.
Figure 12B:
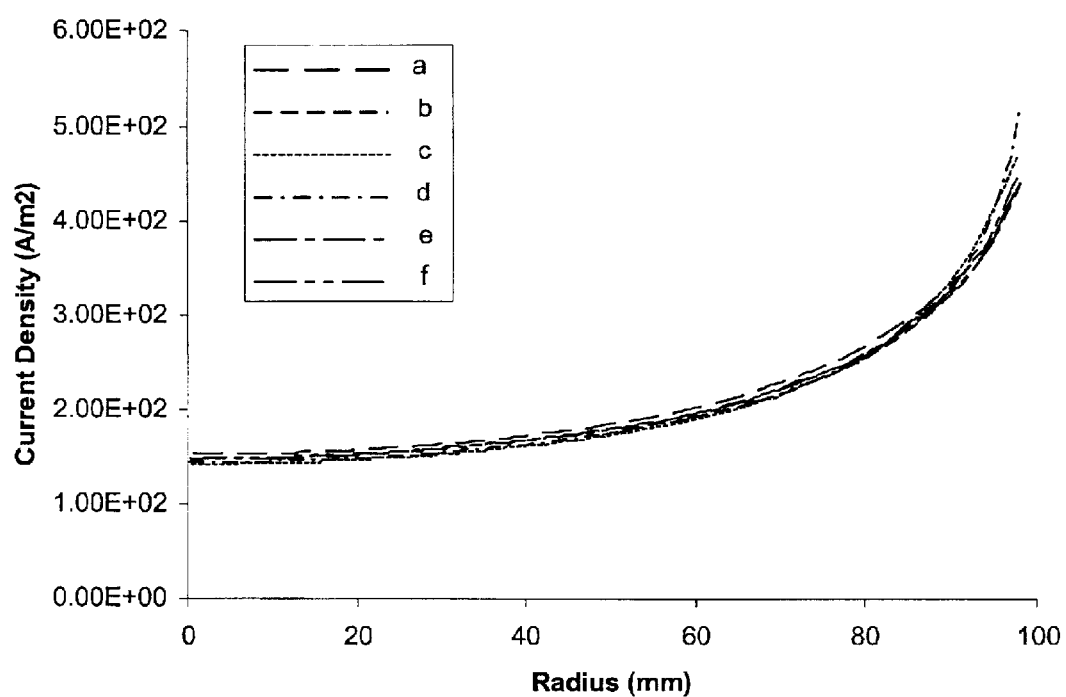
Figure 12C:
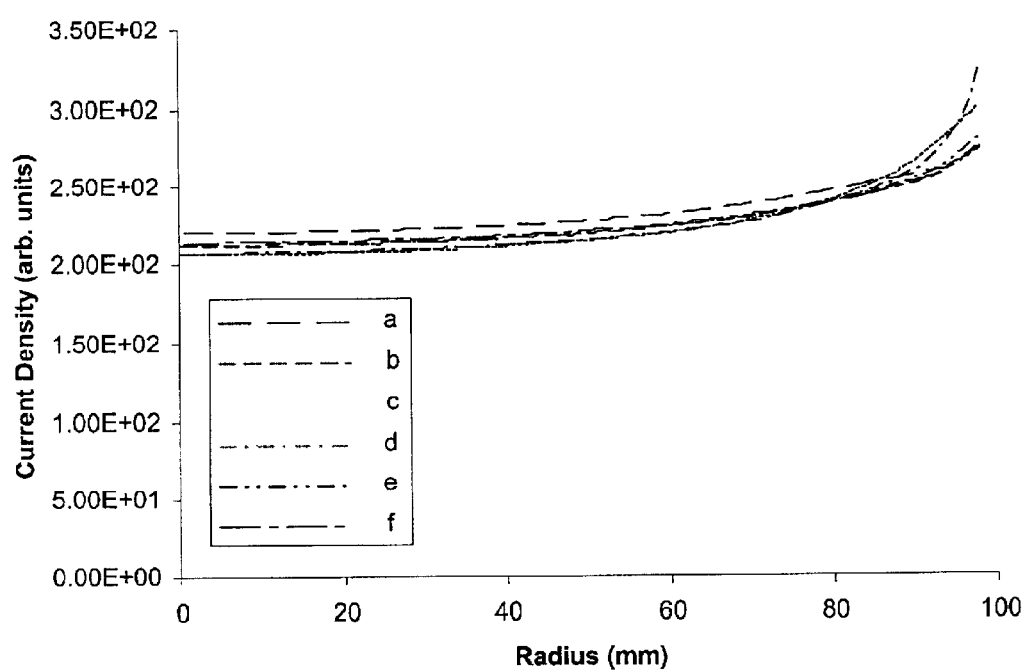

FIGS. 12A–C show that the current density calculated in the absence of fluid flow are actually quite similar in most cases, with only cases (c) and (d) showing worse edge uniformity, with case d being the worst one in all cases. Table 1 shows the percent increase of current density at the wafer edge compared to that at the wafer center. Cases (a) and (f) are quite similar for all seed layer thicknesses examined. Cases (b) and (e) are rather similar to cases (a) and (f).

TABLE 1

Percent Current Density Increase at Wafer Edge Compared to the Center

| | Seed Layer Thickness (Ångströms) | | |
|---|---|---|---|
| Case | 500 (set 1) | 1000 (set 2) | 10,000 (set 3) |
| a | 454.9 | 186.9 | 23.4 |
| b | 470.4 | 197.1 | 29.1 |
| c | 512.0 | 225.8 | 44.8 |
| d | 574.6 | 255.8 | 57.2 |
| e | 475.2 | 201.5 | 31.8 |
| f | 462.5 | 193.7 | 28.1 |

While this invention has been described in terms of a few preferred embodiments, it should not be limited to the specifics presented above. Many variations on the above-described preferred embodiments may be employed. Therefore, the invention should be broadly interpreted with reference to the following claims.

What is claimed is:

1. An apparatus for engaging a work piece during plating, the apparatus comprising:
   a cup having a circumferential side wall defining an interior region and a lip within the interior region arranged such that lip can support the work piece while the work piece remains within the interior region;
   a field shaping element shaped and sized to affect an electric field shape impinging on the work piece during plating, the field shaping element designed for connection with the cup;
   a flow path defining a passage for plating fluid to flow from inside the apparatus to outside the apparatus, said flow path residing in a region between the field shaping region and the cup and having an inlet on the inside of the apparatus and proximate the cup's lip and an outlet on the outside of the apparatus and positioned such that the outlet is at a higher elevation than the inlet when the apparatus oriented for use with the cup above the field shaping element; and
   a cone having a work piece contact surface that fits within the cup's interior and can contact the work piece in a manner that holds the work piece in a fixed position against the cup's lip.

2. The apparatus of claim 1, wherein the cup's lip is sized and shaped to support a semiconductor wafer work piece.

3. The apparatus of claim 2, wherein the cup's lip comprises a lipseal made from a material that provides a fluid tight seal with the semiconductor wafer when the wafer is held in place by the cone.

4. The apparatus of claim 3, wherein the lipseal material is an elastomer.

5. The apparatus of claim 1, wherein at least a portion of the cup facing the inside of the apparatus is made from a material selected from the group consisting of a ceramic, plastic-coated ceramic, plastic-coated metal, glasses, glass-coated metals, and composites.

6. The apparatus of claim 5, wherein a plastic used in the coating of the plastic-coated ceramic or metal is a fluoropolymer.

7. The apparatus of claim 5, wherein the ceramic or a ceramic used in the plastic-coated ceramic is alumina or zirconia.

8. The apparatus of claim 1, further comprising one or more actuators for moving the work piece into and out of the plating fluid, while the work piece is held in position by the cup and cone.

9. The apparatus of claim 8, wherein the one or more actuators can pivot the work piece about an axis defined on or proximate the work piece.

10. The apparatus of claim 1, wherein the cup and the field shaping element together form a unitary element.

11. The apparatus of claim 1, wherein the cup and the field shaping element are separate elements held in fixed positions with respect to one another by a fastener.

12. The apparatus of claim 11, wherein the fastener allows a separation distance between the cup and field shaping element to be adjusted to thereby adjust a dimension of the flow path.

13. The apparatus of claim 1, wherein said flow path has a slot shape that is substantially coextensive with the cup's circumferential side wall.

14. The apparatus of claim 1, wherein said flow path has a hole shape.

15. The apparatus of claim 14, further comprising additional hole shaped flow paths distributed about the cup's circumferential side wall.

16. The apparatus of claim 14, wherein the inlet to the flow path has a grooved channel.

17. The apparatus of claim 14, wherein the cup and cone are configured to hold the work piece in a workpiece plane, and wherein the flow path is angled at an offset angle measured in the workpiece plane from a radial vector from a center line inside the apparatus toward the outside of the apparatus.

18. The apparatus of claim 1, wherein a portion of the cup separating the lipseal from the flow path has a thickness of between about 0.25 and 2.0 millimeters.

19. The apparatus of claim 1, wherein a portion of the cup separating the lipseal from the flow path has a thickness of between about 0.5 and 1.25 millimeters.

20. The apparatus of claim 1, wherein the flow path length is between about 30 and 60 millimeters.

21. The apparatus of claim 1, wherein the flow path length is between about 35 and 50 millimeters.

22. The apparatus of claim 17, wherein the offset angle is between about 25 and 50 degrees.

23. The apparatus of claim 17, wherein the offset angle is about 45 degrees.

24. A method of plating a material onto a work piece, the method comprising:
   holding the work piece between a cone and a cup of an apparatus, wherein the cup has a circumferential side wall defining an interior region and a lip within the interior region and supporting the work piece while the work piece remains within the interior region, and wherein the cone has a work piece contact surface that fits within the cup's interior and contacts the work piece in a manner that holds the work piece in a fixed position against the cup's lip;
   immersing the work piece in the plating fluid prior to plating, wherein the work piece has a substantially flat plating surface and wherein the holding step comprises holding the substantially flat plating surface in an orientation that is not parallel to a plane defined by a plating fluid surface; and
   while plating, directing a plating fluid through a flow path defining a passage for the plating fluid to flow from inside the apparatus to outside the apparatus, said flow path defined by the cup and the field shaping element, having an inlet on the inside of the apparatus and an outlet on the outside of the apparatus and positioned such that the outlet is at a higher elevation than the inlet, whereby gas present in a portion of the plating fluid in the flow path travels toward the outlet due to its buoyancy.

25. The method of claim 24, further comprising directing the plating fluid toward a substantially flat plating surface of the work piece, thereby setting up a circulation pattern in which the plating fluid flows along the plating surface and through the flow path.

26. The method of claim 24, further comprising rotating the work piece about an axis substantially parallel to the circumferential side-wall.

27. The method of claim 24, wherein work piece is a semiconductor wafer.

28. The method of claim 27, wherein the work piece is positioned on a lipseal of the lip to thereby provide a fluid tight seal with the semiconductor wafer when the wafer is held in place by the cone.

29. The method of claim 24, wherein at least a portion of the cup facing the inside of the apparatus is made from a material selected from the group consisting of a ceramic, plastic-coated ceramic, plastic-coated metal, and composites.

30. The method of claim 24, further comprising fastening the cup to a field shaping element together at a specified separation distance to thereby define a dimension of the flow path.

31. The method of claim 30, further comprising adjusting the separation distance to thereby adjust the dimension of the flow path.

32. The method of claim 24, wherein said flow path has a slot shape that is substantially coextensive with the cup's circumferential side wall.

33. The method of claim 24, wherein said flow path has a hole shape.

34. The method of claim 33, further comprising additional hole shaped flow paths distributed about the cup's circumferential side wall.

35. The method of claim 33, wherein the inlet to the flow path has a grooved channel.

36. The method of claim 33, wherein the fixed position of the holding step defines a workpiece plane and wherein the flow path is angled at an offset angle measured in the workpiece plane from a radial vector from a center line inside the apparatus toward the outside of the apparatus.

37. The method of claim 24, wherein the plating fluid is an electrolyte and electroplating is the method of plating.

38. The method of claim 24, wherein the plating fluid contains metal ions and electroless plating is the method of plating.

39. An apparatus for engaging a work piece during plating, the apparatus comprising:
    a cup having a circumferential side wall defining an interior region and a lip within the interior region arranged such that lip can support the work piece in a first plane while the work piece remains within the interior region, the cup having a first surface defined in part by a thickness of the lip, at least a portion of the first surface being curved and substantially non-parallel to the first plane;
    a field shaping element shaped and sized to affect an electric field shape impinging on the work piece during plating, the field shaping element having a second surface substantially in conformity with the first surface, thereby defining a flow path between the first surface and the second surface and forming a passage for plating fluid to flow from inside the apparatus to outside the apparatus, said flow path having an inlet on the inside of the apparatus and proximate the cup's lip and an outlet on the outside of the apparatus and positioned such that the outlet is at a higher elevation than the inlet when the apparatus oriented for use with the cup above the field shaping element; and
    a cone having a work piece contact surface that fits within the cup's interior and configured to contact the work piece in a manner that holds the work piece in a fixed position against the cup's lip.

40. An apparatus for engaging a work piece during plating, the apparatus comprising:
    a cup having a circumferential side wall defining an interior region and a lip within the interior region arranged such that lip can support the work piece in a first plane while the work piece remains within the interior region;
    a field shaping element shaped and sized to affect an electric field shape impinging on the work piece during plating, the field shaping element defining a snorkel-shaped flow path between the field-shaping element and the cup, forming a passage for plating fluid to flow from inside the apparatus to outside the apparatus, said snorkel-shaped flow path having an inlet on the inside of the apparatus proximate the cup's lip and an outlet on the outside of the apparatus and positioned such that the outlet is at a higher elevation than the inlet when the apparatus oriented for use with the cup above the field shaping element; and
    a cone having a work piece contact surface that fits within the cup's interior and configured to contact the work piece in a manner that holds the work piece in a fixed position against the cup's lip.

41. An apparatus for engaging a work piece during plating, the apparatus comprising:
    a cup having a circumferential side wall defining an interior region and a lip within the interior region arranged such that lip can support the work piece in a first plane while the work piece remains within the interior region, the cup comprising a plurality of flow holes disposed below the lip, the plurality of flow holes shaped and sized to affect an electric field shape impinging on the work piece during plating, the plurality of flow holes defining a plurality of flow paths for plating fluid to flow from inside the apparatus to outside the apparatus, each of the flow paths having an inlet on the inside of the apparatus and proximate the cup's lip and an outlet on the outside of the apparatus and positioned such that the outlet is at a higher elevation than the inlet when the apparatus oriented for use; and
    a cone having a work piece contact surface that fits within the cup's interior and can contact the work piece in a manner that holds the work piece in a fixed position against the cup's lip.

42. The apparatus of claim 41, wherein the plurality of flow holes define snorkel-shaped flow paths.

43. The apparatus of claim 41, wherein the fixed position defines a workpiece plane and wherein the plurality of flow holes are offset from a radial direction of the cup, the offset measured in a plane parallel to the workpiece plane.

44. The apparatus of claim 41, wherein the plurality of flow holes comprise a grooved inlet.

45. The apparatus of claim 43, wherein the offset is between about 25 degrees to 50 degrees.

* * * * *